(12) United States Patent
Okhonin

(10) Patent No.: US 9,012,960 B2
(45) Date of Patent: Apr. 21, 2015

(54) PHOTO DETECTOR AND METHODS OF MANUFACTURING AND OPERATING SAME

(75) Inventor: Serguei Okhonin, Lausanne (CH)

(73) Assignee: Actlight, S.A., Lausanne (CH)

( * ) Notice: Subject to any disclaimer, the term of this patent is extended or adjusted under 35 U.S.C. 154(b) by 94 days.

(21) Appl. No.: 13/481,891

(22) Filed: May 28, 2012

(65) Prior Publication Data

US 2012/0313155 A1 Dec. 13, 2012

Related U.S. Application Data

(60) Provisional application No. 61/495,450, filed on Jun. 10, 2011, provisional application No. 61/603,496, filed on Feb. 27, 2012.

(51) Int. Cl.
*H01L 29/49* (2006.01)
*H01L 31/0224* (2006.01)
*H01L 31/113* (2006.01)
*H01L 21/00* (2006.01)

(52) U.S. Cl.
CPC .... *H01L 31/022408* (2013.01); *H01L 31/1136* (2013.01)

(58) Field of Classification Search
USPC .............. 257/225, 24, 30, 222, 290, 431, 257/E21.131, E21.151
See application file for complete search history.

(56) References Cited

PUBLICATIONS

Salman, et al., "Field Effect Diode (FED): A novel device for ESD protection in deep sub-micron SOI technologies", Electron Devices Meeting, 2006. IEDM '06. International, pp. 1-4.
Raissi et al., "A brief analysis of the field effect diode and breakdown transistor", IEEE Transactions on Electron Devices, vol. 43, Issue 2, pp. 362-365.

*Primary Examiner* — Michael Shingleton
(74) *Attorney, Agent, or Firm* — Wilmer Cutler Pickering Hale and Dorr LLP

(57) ABSTRACT

A photo detector comprising a first doped impurity region (adapted to receive a first voltage) disposed in or on a substrate; a body region, juxtaposed the first doped impurity region; a gate (adapted to receive a second voltage) spaced from a first portion of the body region; a light absorbing region, juxtaposed a second portion of the body region, includes a material which, in response to light incident thereon, generates carrier pairs including a first and second type carriers; a contact region (adapted to receive a third voltage) juxtaposed the light absorbing region; wherein, in response to incident light, the gate attracts first type carriers of the carrier pairs to the first portion of the body region which causes second carriers from the first doped impurity region to flow to the contact region, and the contact region attracts second type carriers.

22 Claims, 40 Drawing Sheets

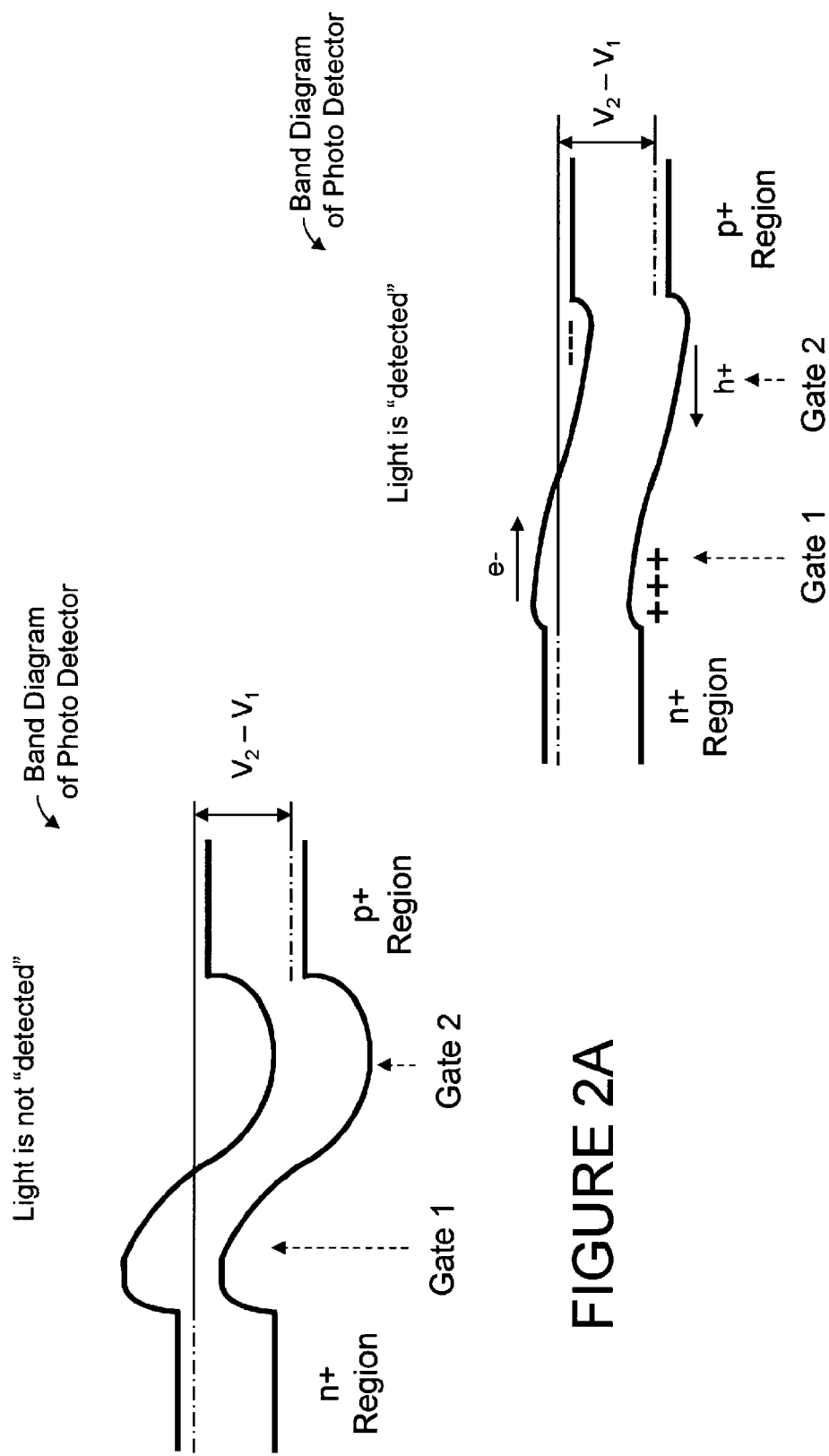

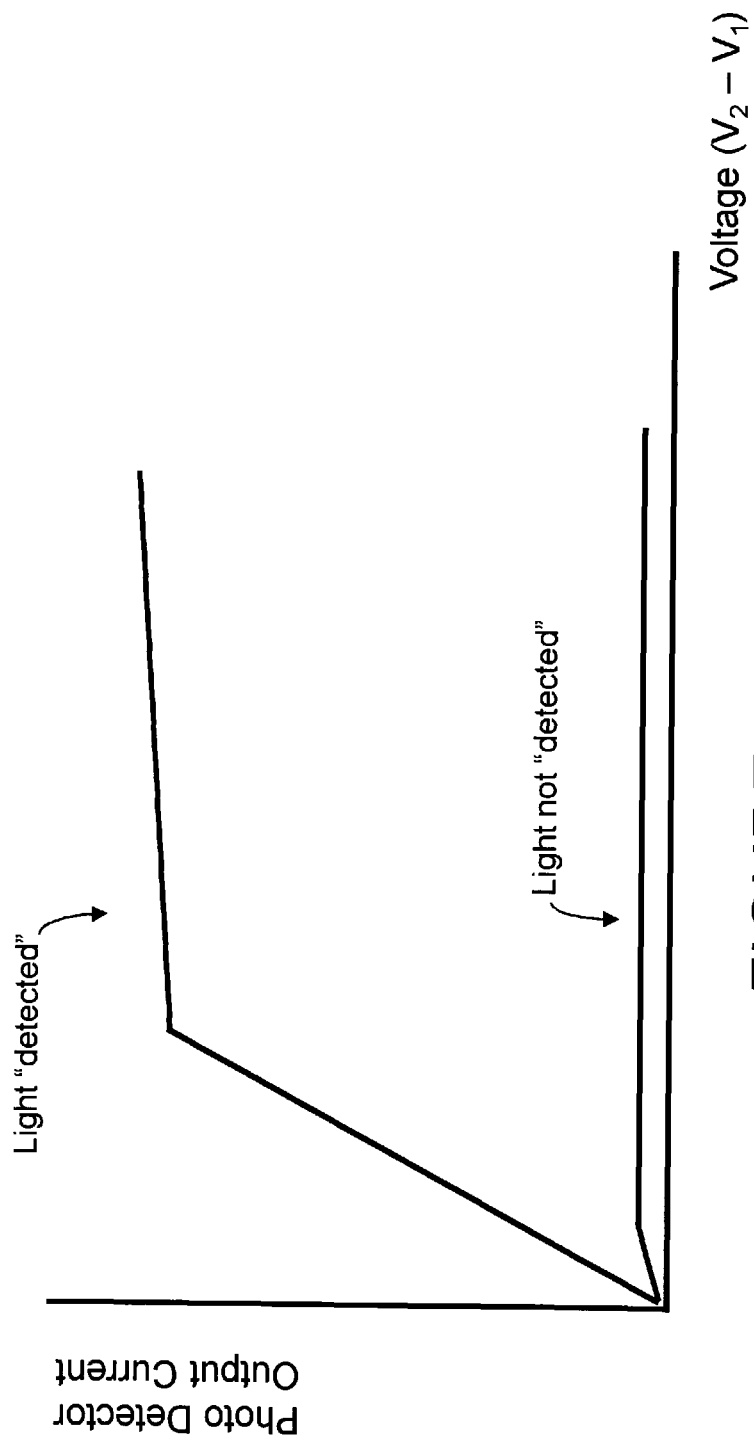

PHOTO DETECTOR AND METHODS OF MANUFACTURING AND OPERATING SAME

RELATED APPLICATION

This non-provisional application claims priority to U.S. Provisional Application No. 61/495,450, entitled "Light Sensors and Methods of Operating Same", filed Jun. 10, 2011, and U.S. Provisional Application No. 61/603,496, entitled "Light Sensors having Light Absorbing Region, and Methods of Operating Same", filed Feb. 27, 2012; the contents of these U.S. Provisional Patent Applications are incorporated by reference herein in their entirety.

INTRODUCTION

There are many inventions described and illustrated herein, as well as many aspects and embodiments of those inventions. In one aspect, the present inventions relate to, among other things, monolithic detectors or sensors to detect light (for example, output from an optical fiber) and, in response thereto, to generate an electrical signal. In another aspect, the present inventions also relate to methods of control and manufacturing such monolithic light sensors or photo detectors (whether such sensors/detectors are discrete devices or integrated with other circuitry, for example, communication receivers and/or transceivers). Notably, the monolithic light sensors or photo detectors of the present inventions may be implemented in high-speed data communication systems that employ an optical fiber for data transmission.

SUMMARY

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

Importantly, this Summary may not be reflective of or correlate to the inventions protected by the claims in this or continuation/divisional applications hereof. Even where this Summary is reflective of or correlates to the inventions protected by the claims hereof, this Summary may not be exhaustive of the scope of the present inventions.

In a first aspect, the present inventions are directed to a monolithic photo detector disposed in a substrate (for example, an SOI or a bulk substrate), the monolithic photo detector comprising: a first doped impurity region disposed in or on the substrate, wherein the first doped impurity region is adapted to receive a first voltage, a body region (for example, an intrinsic or doped semiconductor material), juxtaposed the first doped impurity region, disposed in or on the substrate and a first gate disposed over and spaced from a first portion of the body region, wherein the gate is adapted to receive a second voltage. The monolithic photo detector of this aspect of the invention also includes a light absorbing region (for example, germanium, silicon-germanium or gallium arsenide) having a first major surface which is juxtaposed a second portion of the body region, wherein the light absorbing region includes at least one material which, in response to light incident thereon, carrier pairs are generated, each pair including a first type carrier and a second type carrier, and a contact region, juxtaposed a second major surface of the light absorbing region, wherein the contact region is adapted to receive a third voltage. In operation, the first gate of the detector attracts first type carriers of the carrier pairs to the first portion of the body region which, in response, causes second carriers from the first doped impurity region to flow through the light absorbing region to the contact region, and the contact region attracts second type carriers of the carrier pairs.

In one embodiment, the first doped impurity region and the contact region include p-type semiconductor materials. In another embodiment, the first doped impurity region and the contact region include n-type semiconductor materials.

In another embodiment, the monolithic photo detector further includes a second doped impurity region disposed in or on the substrate and juxtaposed the body region, wherein the second doped impurity region is adapted to receive the first voltage, and a second gate disposed over and spaced from a third portion of the body region, wherein the gate is adapted to receive the second voltage. In response to incident light, the second gate attracts first type carriers of the carrier pairs to the third portion of the body region which, in response, causes second carriers from the second doped impurity region to flow through the light absorbing region to the contact region, and the contact region attracts second type carriers of the second doped impurity region.

In one embodiment, the first and second doped impurity regions and the contact region include p-type semiconductor materials. In another embodiment, the light absorbing region includes a material having an electron mobility which is greater than the electron mobility of the material of the body region. Notably, the light absorbing region further includes a carrier generation region (for example, germanium, gallium-arsenide or silicon-germanium, combinations thereof, and/or a highly doped semiconductor material).

In yet another embodiment, the contact region is disposed in the substrate and laterally displaced from the light absorbing region. Indeed, the contact region may be juxtaposed and displaced from the second major surface of the light absorbing region. For example, the contact region may be displaced from the second major surface of the light absorbing region by a region of the substrate disposed under a second gate.

In yet another aspect, the present inventions are directed to a monolithic photo detector disposed in a substrate, the monolithic photo detector comprising a first doped impurity region disposed in the substrate, wherein the first doped impurity region is adapted to receive a first voltage, a second doped impurity region disposed in the substrate, wherein the second doped impurity region is adapted to receive the voltage (which may be the same as the first voltage), a body region, juxtaposed the first and second doped impurity regions, disposed in the substrate, and a gate spaced from a first portion of the body region, wherein the gate is adapted to receive a second voltage. The photo detector also includes light absorbing region having a first major surface which is juxtaposed and in contact with a second portion of the body region, wherein the light absorbing region includes one or more materials which, in response to light incident thereon, generate carrier pairs each pair including a first type carrier and a second type carrier, and a contact region, juxtaposed and in contact with a second major surface of the light absorbing region, wherein the contact region is adapted to receive a third voltage. In response to incident light, the gate attracts first type carriers of the carrier pairs to the first portion of the body region which, in response, causes second carriers from the first and second doped impurity regions to flow through the light absorbing region to the contact region, and the contact region attracts second type carriers.

In one embodiment, the first doped impurity region and the contact region include p-type semiconductor materials. In another embodiment, the first doped impurity region and the contact region include n-type semiconductor materials.

In one embodiment, the first and second doped impurity regions and the contact region include p-type semiconductor materials. In another embodiment, the light absorbing region includes a material having an electron mobility which is greater than the electron mobility of the material of the body region. Notably, the light absorbing region further includes a carrier generation region (for example, germanium, gallium-arsenide or silicon-germanium, combinations thereof, and/or a highly doped semiconductor material).

As stated herein, there are many inventions, and aspects of the inventions, described and illustrated herein. This Summary is not exhaustive of the scope of the present inventions. Indeed, this Summary may not be reflective of or correlate to the inventions protected by the claims in this or continuation/divisional applications hereof.

Moreover, this Summary is not intended to be limiting of the inventions or the claims (whether the currently presented claims or claims of a divisional/continuation application) and should not be interpreted in that manner. While certain embodiments have been described and/or outlined in this Summary, it should be understood that the present inventions are not limited to such embodiments, description and/or outline, nor are the claims limited in such a manner (which should also not be interpreted as being limited by this Summary).

Indeed, many other aspects, inventions and embodiments, which may be different from and/or similar to, the aspects, inventions and embodiments presented in this Summary, will be apparent from the description, illustrations and claims hereof. In addition, although various features, attributes and advantages have been described in this Summary and/or are apparent in light thereof, it should be understood that such features, attributes and advantages are not required in any of the embodiments of the present inventions and, indeed, need not be present/incorporated in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

FIGS. 2A and 2B depict the general operation and/or response of the monolithic sensor or detector in connection with an energy band diagram, in accordance with certain aspects of the present inventions, wherein when the sensor does not detect or is not exposed to light, little to no current flows between the p+ and n+ regions due to the barrier provided or caused by the voltages applied to the gates; however, when the sensor detects or is exposed to incident light from one or more light sources, the majority of the positive carriers (i.e., holes) move towards the region 1, disposed under gate 1 (Gate 1), and the majority of the negative carriers (i.e., electrons) move towards the region 2, disposed under gate 2 (Gate 2) and the excess of holes in the region 1 provides, induces or causes a lowering of the potential barrier to electron movement and electron current flow from n+ region while the excess of electrons in the region 2 provides, induces or causes a lowering of the hole barrier and hole current flowing from p+ region; under these circumstances, the sensor is in a conductive state or mode which provides a large internal current gain; additionally a positive feedback mechanism accelerates accumulation of excess carriers under the respective gates, which, in turn, reduce the potential barriers related corresponding to such regions and causes a current to flow between the p+ and n+ regions of the light sensor and an output current upon detecting or in response to the incident light;

FIG. 3 is a graphical illustration of the relative output current of the light sensor or photo detector when the sensor detect light (i.e., light is "on") and when the sensor does not detect light (i.e., light is "off") in accordance with a change in voltage applied to the n+ and p+ regions;

FIG. 12F illustrates a cross-section of the resulting or "final" structure; indeed, where the sensor does not include n+ regions as in several of the exemplary embodiments set forth herein, the n+ processing in connection with the sensor may be omitted;

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

Figure 1A:
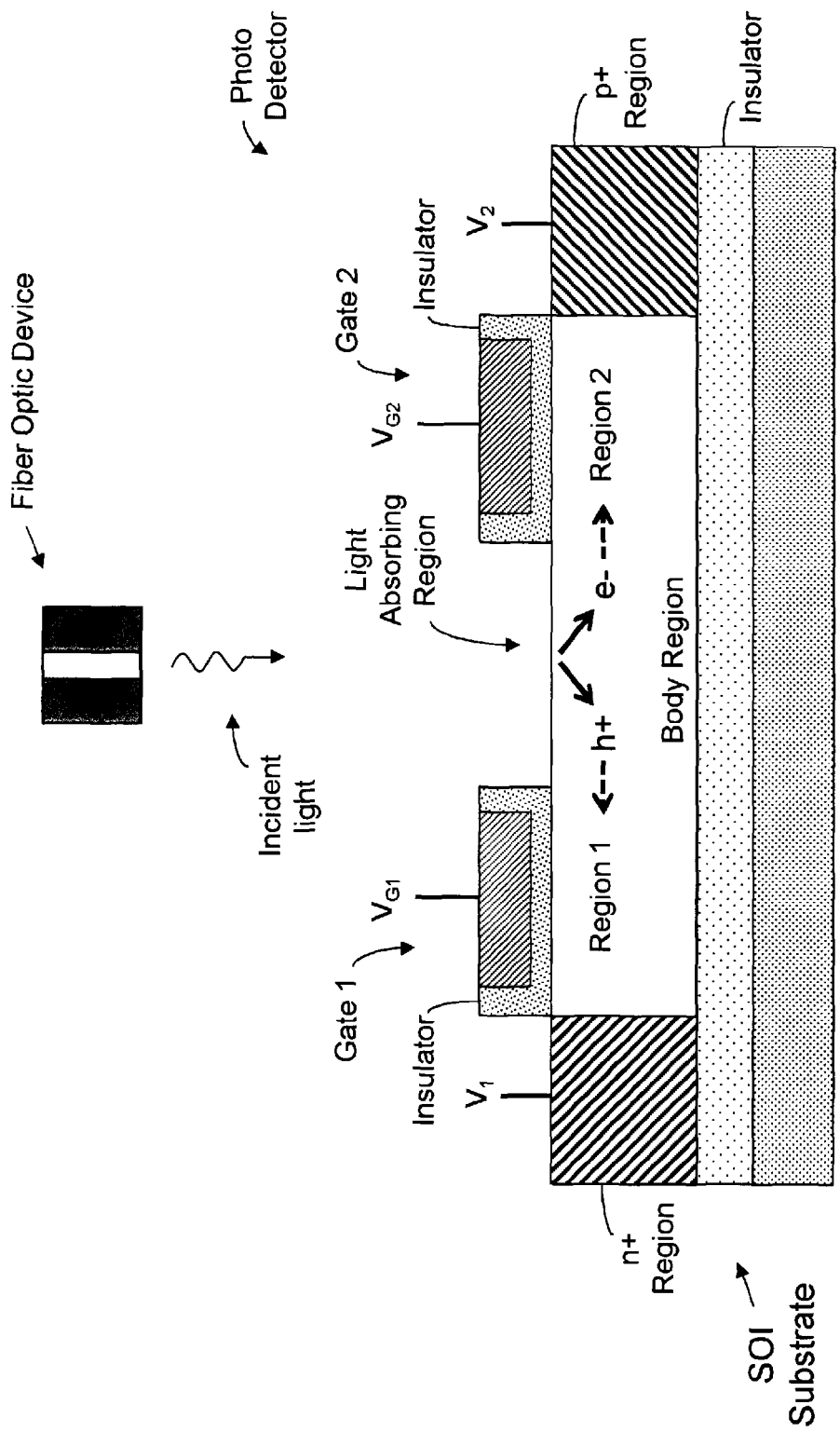
FIG. 1A is a cross-sectional view of an exemplary monolithic light sensor or photo detector according to at least one aspect of the present inventions wherein the sensor, in this illustrated embodiment, is disposed in or on a semiconductor-on-insulator substrate (SOI substrate), for example, a silicon-on-insulator.
Figure 1B:
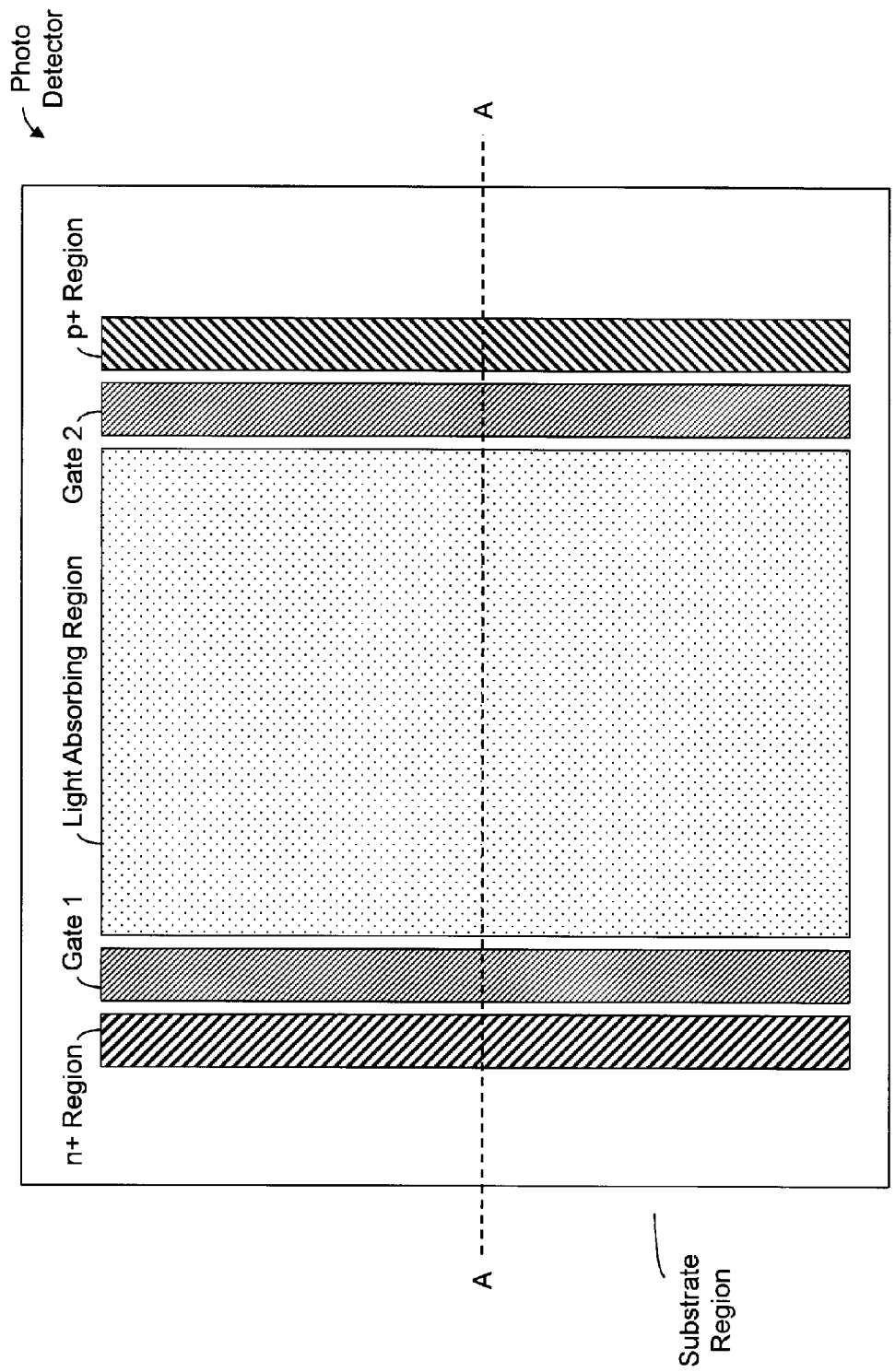
FIGS. 1B and 1C are illustrative top views of the exemplary monolithic light sensor of FIG. 1A according to certain aspects and embodiments of the present inventions; notably, with respect to FIG. 1C, gates 1 and 2 are interconnected as a unitary structure which is identified or designated "Gate"
Figure 1C:
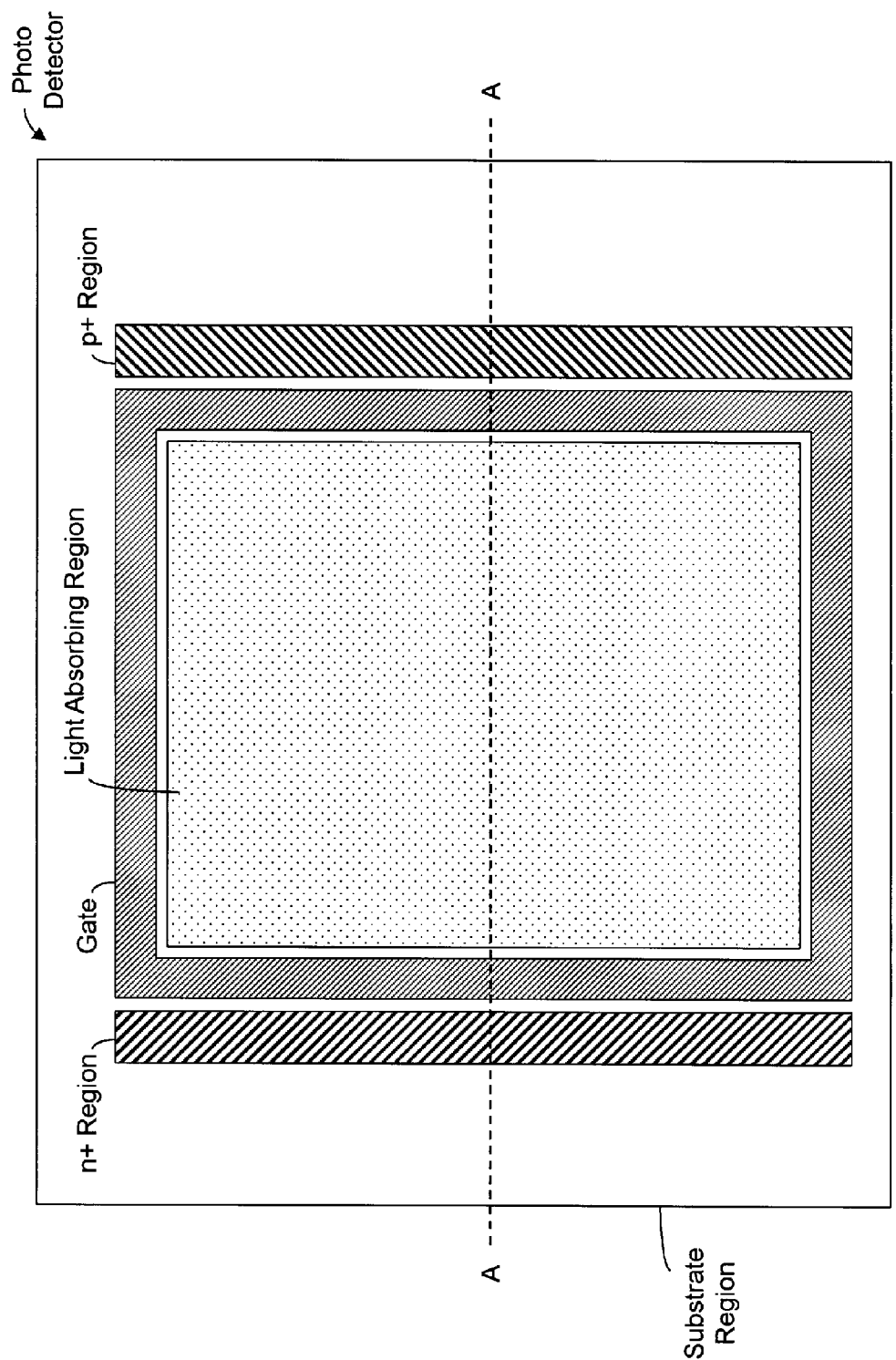

There are many inventions described and illustrated herein. In one aspect, the present inventions are directed to a photo detector and/or array of photo detectors, and method of fabricating and operating such a photo detector and/or array of photo detectors. With reference to FIG. 1A, in a first embodiment, a photo detector according to an aspect of the present inventions includes at least two control nodes or gates (illustrated in the exemplary embodiment as Gate 1 and Gate 2), a light absorbing region, a body region, a first doped region (illustrated in the exemplary embodiment as n+ Region) and a second doped region (illustrated in the exemplary embodiment as p+ Region). The photo detector, in this exemplary embodiment, is fabricated in or on a semiconductor on insulator (SOI) substrate (for example, a silicon or germanium region/layer/material disposed on or over an insulator region/layer/material (for example, a silicon oxide, silicon nitride and/or combination thereof).

Briefly, in one embodiment, the control nodes or gates (hereinafter "gates") may be comprised of a conductive type material (conductor or semiconductor), for example, a metal (for example, aluminum or copper), metal compound and/or a doped semiconductor (for example, silicon doped with donor or acceptor impurities). The gates are spaced from the body region via an insulator or dielectric material (for example, silicon oxide, silicon nitride or combinations or composites thereof, for example, ONO).

The body region may be an intrinsic or doped semiconductor (for example, intrinsic/undoped silicon or germanium or a lightly doped (with donor or acceptor impurities) silicon or germanium) including an intrinsic material or a material having impurities, for example, n-type or p-type materials. Indeed, the body region may be one or more materials from the Group IV semiconductor including silicon, germanium, silicon carbide and/or combinations thereof.

The photo detector according to this embodiment includes at least two doped semiconductor regions including n+ and p+ regions. These doped semiconductor regions may be formed within a semiconductor layer consisting of the body region. For example, the n-type semiconductor material may be formed from or by doping such semiconductor layer (for example, silicon layer) with an n-type impurity (for example, phosphorus or arsenic). The p-type semiconductor material may be formed from or by doping such semiconductor with a p-type impurity (for example, boron). Notably, the doped semiconductor regions (n+ and p+ regions) are outputs of the photo detector of this aspect of the inventions.

Importantly, the photo detector may be fabricated using any materials and/or techniques now known, described herein, and/or later developed.

With continued reference to FIG. 1A, in operation, the photo detector is enabled to detect incident light via application of selected or predetermined voltages to the gates and the doped regions (here, n+ and p+ regions). In one embodiment, a negative voltage applied to Gate 1 (for example, −2V), a negative or zero voltage is applied to the n+ region, a positive voltage applied to Gate 2 (for example, 2V) and a positive voltage (for example, 1V) is applied to the p+ region. Under these conditions and in this state, in response to light (for example, light which is output from a fiber optic device) incident on or applied to the light absorbing region of the photo detector, current flows between the n+ and p+ regions. That is, the applied or incident light generates electron-hole pairs in the body region of the photo detector—where the electrons and holes of such pairs are separated by an electric field within the body region. As noted above, the voltages (for example, static or fixed voltages) applied to the gates, n+ and p+ regions create or provide the electric field within the body region.

In particular, positive carriers (i.e., holes) move towards the region 1, disposed under Gate 1, and negative carriers (i.e., electrons) move towards the region 2, disposed under Gate 2. The excess of holes in the region 1 will induce a lowering of the barrier to electron movement (band gap) and electron current flow from n+ region. Similarly, excess of electrons in the region 2 provides, induces or causes a lowering of the hole barrier and hole current flowing from p+ region. (Compare, FIG. 2A and FIG. 2B). Under these circumstances, the photo detector is in a conductive state or mode which provides a large internal current gain. Additionally, a positive feedback mechanism accelerates accumulation of excess carriers under the respective gates, which, in turn, reduce the potential barriers related corresponding to such regions and causes a current to flow between the p+ and n+ regions of the light sensor and an output current upon detecting or in response to the incident light. (See, for example, FIG. 3).

Notably, in the absence of incident light, little to no current flows between the p+ and n+ regions due to the barrier generated or caused by the voltages applied to Gates 1 and/or 2. (See, for example, FIGS. 2A and 3). Moreover, the photo detector may be disabled via removing/changing the voltages applied to one or more of Gate 1, n+ region, p+ region and/or Gate 2, and/or applying opposite polarity voltages to one or more of Gate 1, n+ region, p+ region and/or Gate 2. For example, increasing the amplitude on one or both of the voltages applied to the gates may place the sensor in a non-conductive state.

The illustrated/exemplary voltage levels to implement or enable sensing by the photo detector are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the voltages applied to Gate 1, n+ region, p+ region and/or Gate 2) become or are positive and negative.

Moreover, the detection time or triggering time of the photo detectors of the present inventions may be programmable or tunable, for example, to meet or accommodate response time specifications as well as power consumption specification. In one embodiment, the voltages applied to the gates are adjusted to increase the response time of the photo detector—for example, by increasing the electric field within the body region. Here, the electric field between the gate and associated region is adjusted (for example, increased) to adjust the response time (for example, increase) of the photo detector. In another embodiment, the voltages applied to the gates are adjusted to reduce the power consumption of the photo detector. Thus, the response time and/or power consumption may be controlled, adjusted and/or programmed to, for example, accommodate desired/required specifications of the photo detector. All permutations response time and/or power consumption, and combinations of thereof, are intended to fall within the scope of the present inventions.

In addition thereto, or in lieu thereof, in one embodiment, the photo detector is placed in a predetermined state before sensing the light (or data). For example, carriers may be removed from the body region prior to sensing so that the concentration of carriers in the body region (and beneath the gates (Regions 1 and 2)) at the initiation of sensing is below a predetermined value. In one embodiment, the photo detector is placed in a predetermined state by applying the same voltage to the first and second doped regions (i.e., $V_1=V_2$) and applying voltage pulses to the gates Gate 1 and Gate 2 to remove carriers from the body region thereby providing depletion regions under gates Gate 1 and Gate 2. Establishing the photo detector in a predetermined state (for example, periodically) before sensing may enhance or increase the stability and/or accuracy of the photo detector during sensing.

Figure 4A:
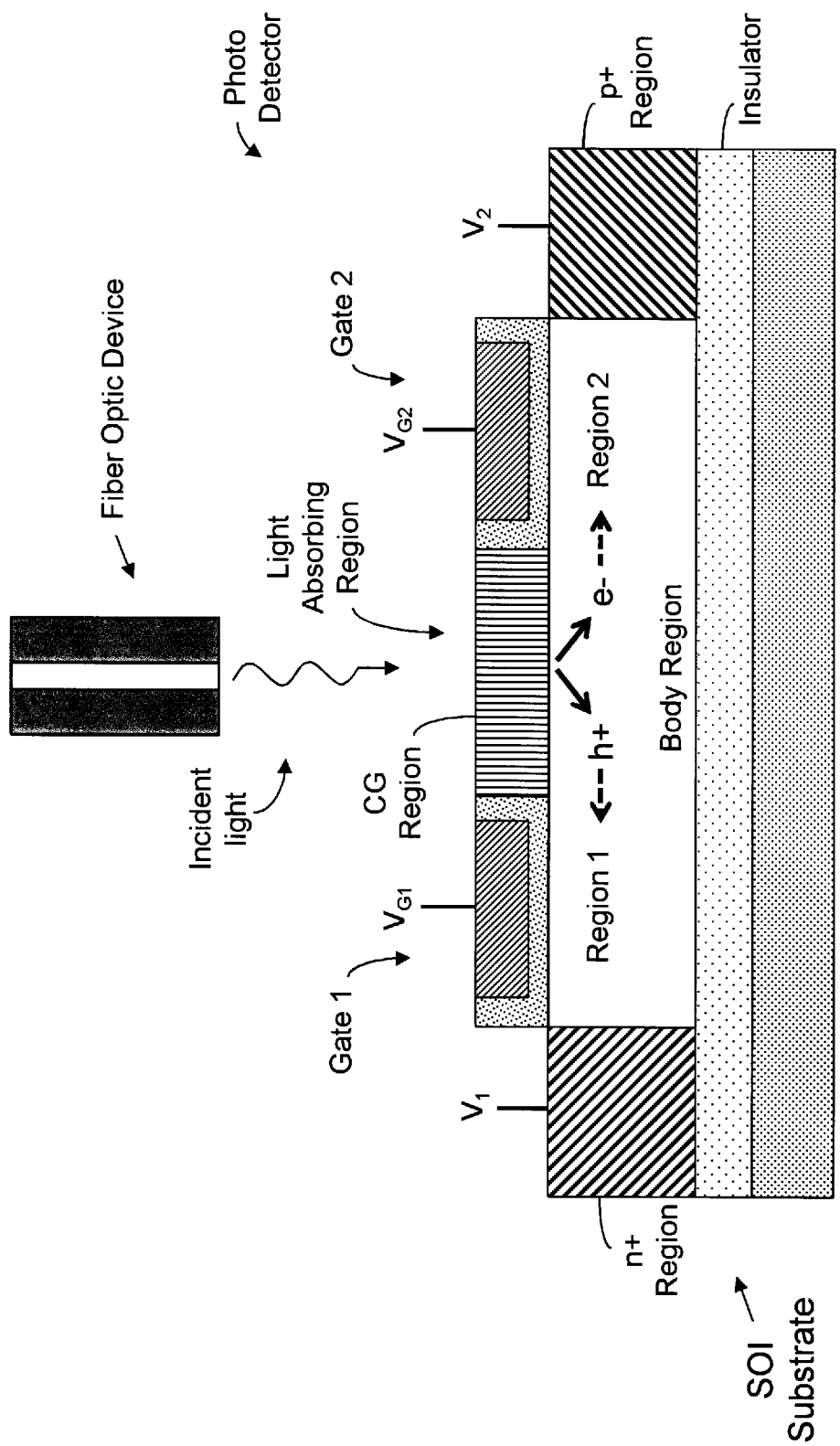
FIG. 4A is a cross-sectional view of another exemplary monolithic light sensor or photo detector according to another embodiment of the present inventions, wherein the sensor, in this illustrative embodiment, is disposed in or on an SOI substrate and includes a carrier generation region (CG region) disposed between control nodes or gates (illustrated in the exemplary embodiment as Gate 1 and Gate 2); the CG region may include a material which facilitates greater/higher generation of carriers in response to incident light wherein, in one embodiment, the CG region includes a material which generates more electron-hole carriers, relative to the sensor embodiment of FIG. 1A, in response to incident light; in one embodiment, the CG region includes germanium, gallium-arsenide or silicon-germanium, or combinations thereof (for example, both germanium and gallium-arsenide), and/or a highly doped semiconductor material (for example, highly doped silicon) which is more responsive to photons than a similar undoped or a lightly doped semiconductor material.

With reference to FIG. 4A, in another embodiment, the photo detector according to an aspect of the present inventions a carrier generation region (CG region) in addition to at least two control nodes or gates (illustrated in the exemplary embodiment as Gate 1 and Gate 2), a light absorbing region, a body region, a first doped region (illustrated in the exemplary embodiment as n+ Region) and a second doped region (illustrated in the exemplary embodiment as p+ Region). The CG region may include a material which facilitates greater/higher generation of carriers in response to incident light. That is, in one embodiment, the CG region includes a material which generates more electron-hole carriers, relative to the embodiment illustrated in FIG. 1A, in response to incident light. For example, in one embodiment, the CG region includes germanium, gallium-arsenide or silicon-germanium, or combinations thereof (for example, both germanium and gallium-arsenide). The CG region may also include a highly doped semiconductor material (for example, highly doped silicon) which is more responsive to photons than a similar undoped or a lightly doped semiconductor material.

In this embodiment, in response to an incident light, electrons and holes are created in the CG region and thereafter then move into the body region (due to the electric field formed by the voltages applied to the gates, n+ region and p+ region. Then, as described above with respect to the photo detector of FIG. 1A, the electrons and holes are "separated" within the body region by an electric field provided by the voltages applied to the gates, n+ region and p+ region. Notably, the operation thereafter is substantially the same as described above with respect to the photo detector of FIG. 1A and, as such, for the sake of brevity will not be repeated.

The CG region in this embodiment facilitates greater/higher generation of carriers in response to incident light having the same or lower photon energy. As such, the photo detector of FIG. 4A may detect light (photon transmission) having a lower energy in connection with the transmission thereof.

In another embodiment, the CG region includes a material that is less responsive to photon energy. In this embodiment, the CG region includes a material which generates fewer electron-hole carriers, relative to the embodiment illustrated in FIG. 1A, in response to incident light. For example, in one embodiment, the CG region includes amorphous silicon or lightly doped polycrystalline silicon. The photo detector of this embodiment may be less susceptible to noise that may be present on or in the incident light (data).

Figure 4B:
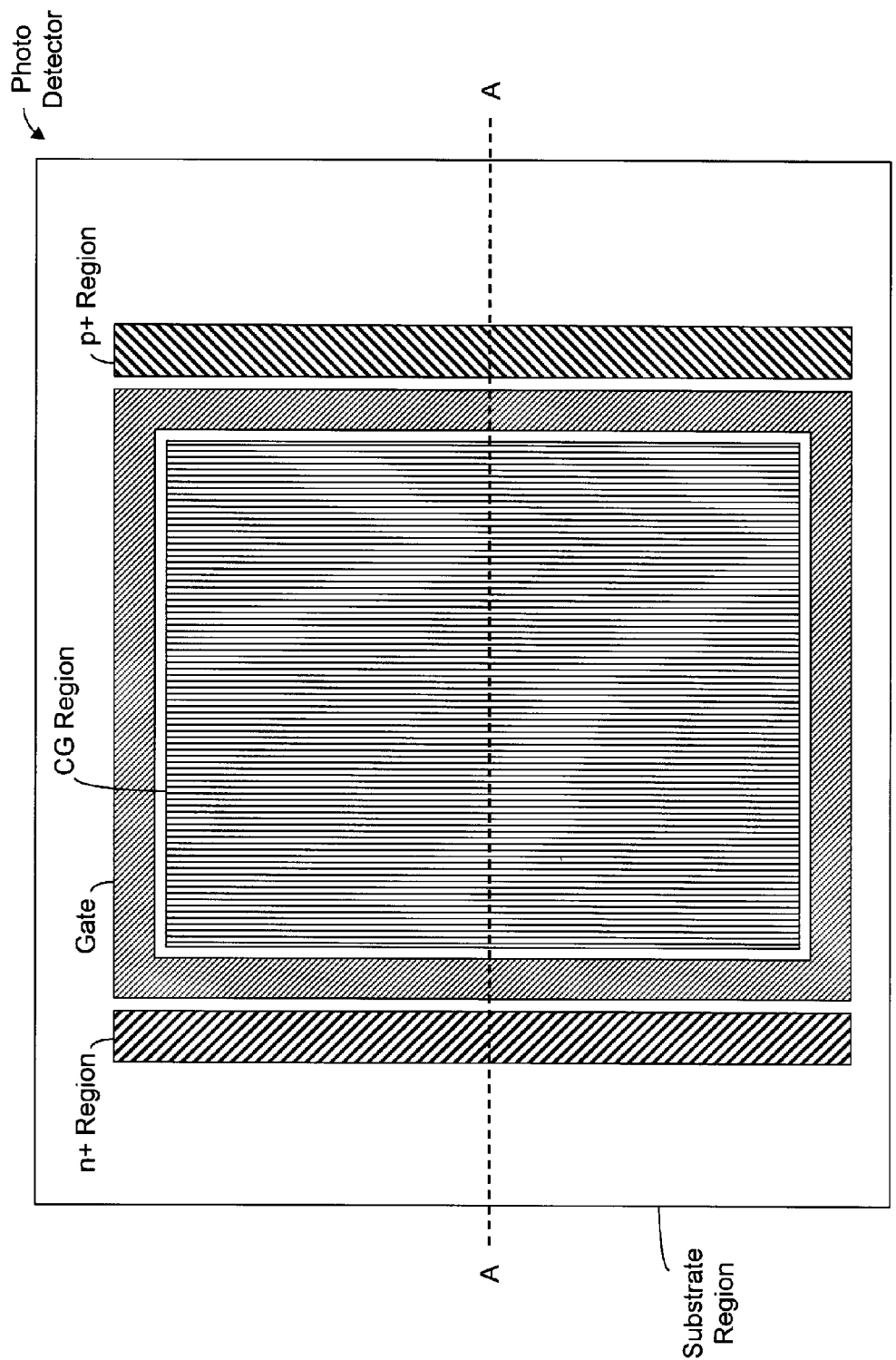
FIGS. 4B and 4C are illustrative top views of the exemplary monolithic light sensor of FIG. 4A according to certain aspects and embodiments of the present inventions.
Figure 4C:
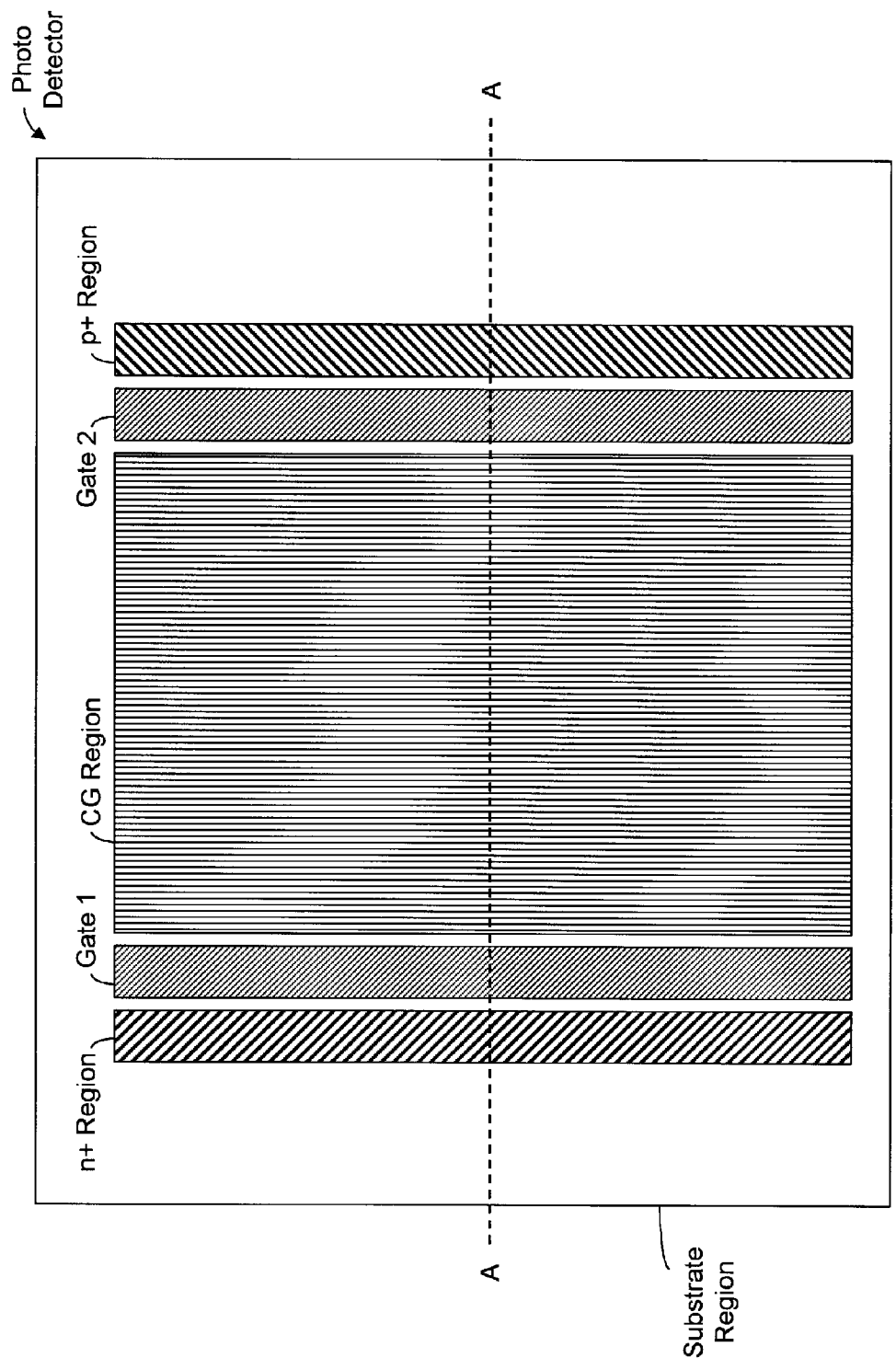

Notably, FIGS. 4B and 4C illustrate exemplary top views of the cross-sectional views of the photo detectors of FIG. 4A wherein dotted lines A-A indicate the location of the cross-sectional views of FIGS. 4B and 4C. With respect to FIG. 4B, gates 1 and 2 are interconnected as one structure.

Figure 5A:
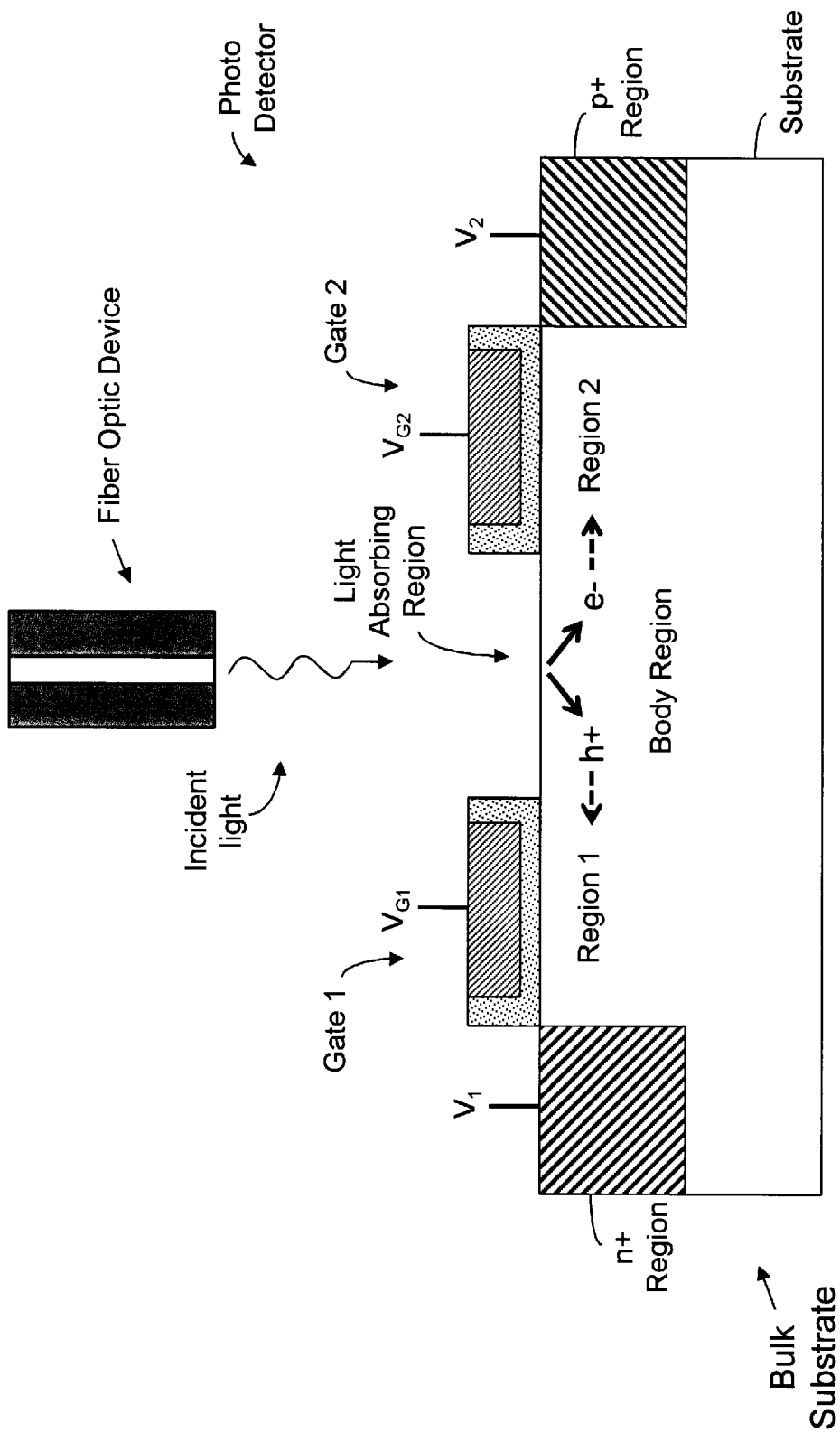
FIGS. 5A and 5B are cross-sectional views of exemplary monolithic light sensor or photo detector according to another embodiment of the present inventions wherein the light sensor, however in these illustrated embodiments (and unlike the embodiments of FIGS. 1A and 4A), the sensors are disposed in or on a bulk substrate (for example, one or more materials from the Group IV semiconductor including silicon (such as, bulk-silicon substrate), germanium, and silicon carbide)
Figure 5B:
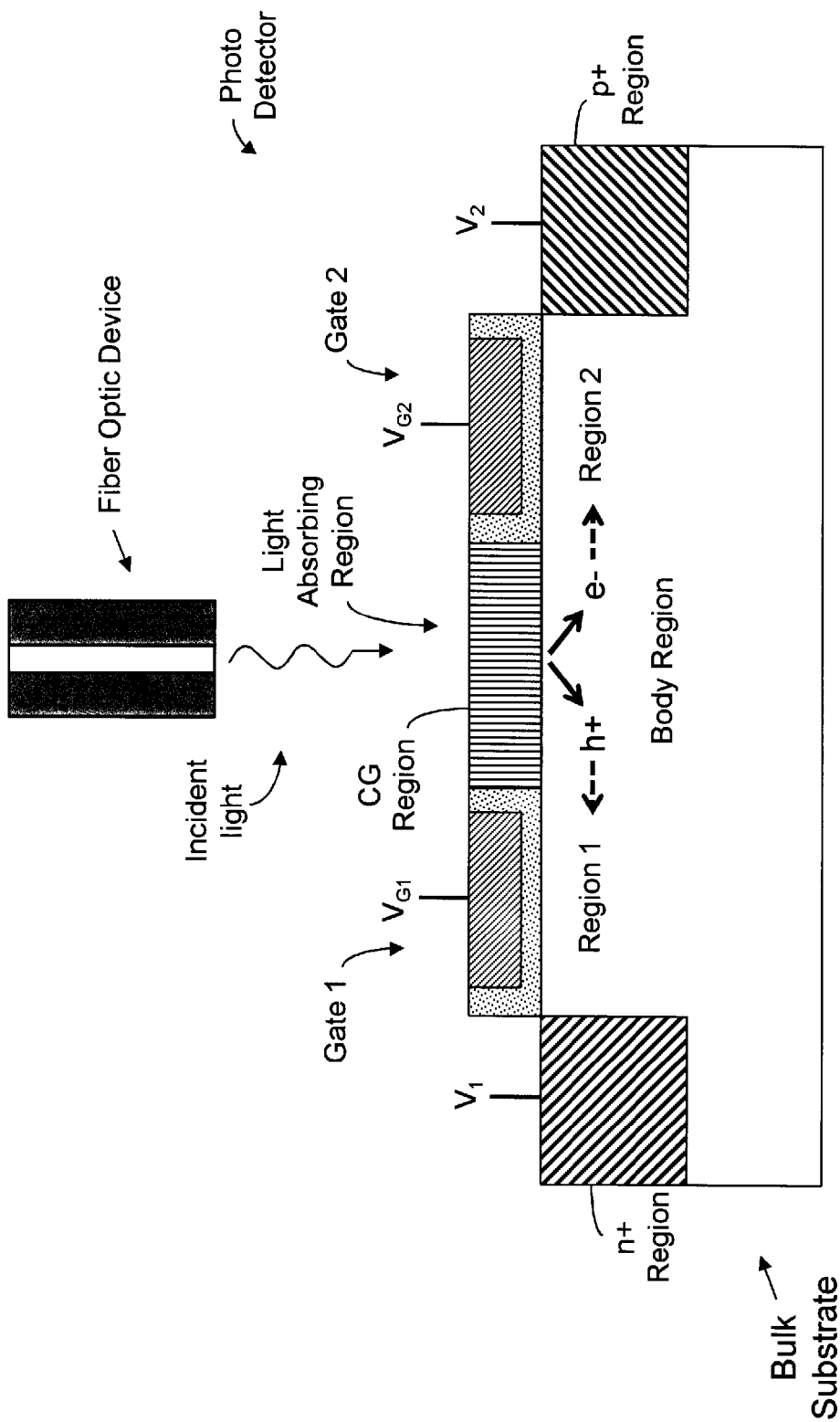

With reference to FIGS. 5A and 5B, in yet another embodiment, the photo detector of the present inventions may be fabricated on or in a bulk wafer/substrate. The discussion above pertaining to the materials, fabrication and operation, in relation to the embodiments corresponding to the SOI wafer/substrate, are entirely applicable here. That is, with reference to FIGS. 5A and 5B, a photo detector according to this embodiment of the present inventions includes at least two control nodes or gates (illustrated in the exemplary embodiment as Gate 1 and Gate 2), a light absorbing region, a body region, a first doped region (illustrated in the exemplary embodiment as n+ Region) and a second doped region (illustrated in the exemplary embodiment as p+ Region). The photo detector, in this exemplary embodiment, is fabricated in or on a bulk semiconductor wafer/substrate (for example, undoped or lightly doped silicon, germanium, or gallium arsenide.

Notably, where the photo detector is fabricated in or on a bulk semiconductor wafer/substrate, the low or lightly doped silicon substrate may "appear" as a dielectric in those instances where the photo detector device operates at high frequencies. As such, in operation, a significant majority of the carriers are maintained in a region of the body near the surface of the device closest to the incident light. In this way, a current is formed between the n+ and p+ regions in the body region immediately below the gates.

As mentioned above, the detection time or triggering time of the exemplary photo detectors of FIGS. 5A and 5B may be programmable or tunable, for example, to meet or accommodate response time specifications as well as power consumption specification. In one embodiment, the voltages applied to the gates are adjusted to increase the response time of the photo detector (for example, by increasing the electric field). In another embodiment, the voltages applied to the gates are adjusted to reduce the power consumption of the photo detector. All permutations and combinations thereof are intended to fall within the scope of the present inventions.

Figure 6A:
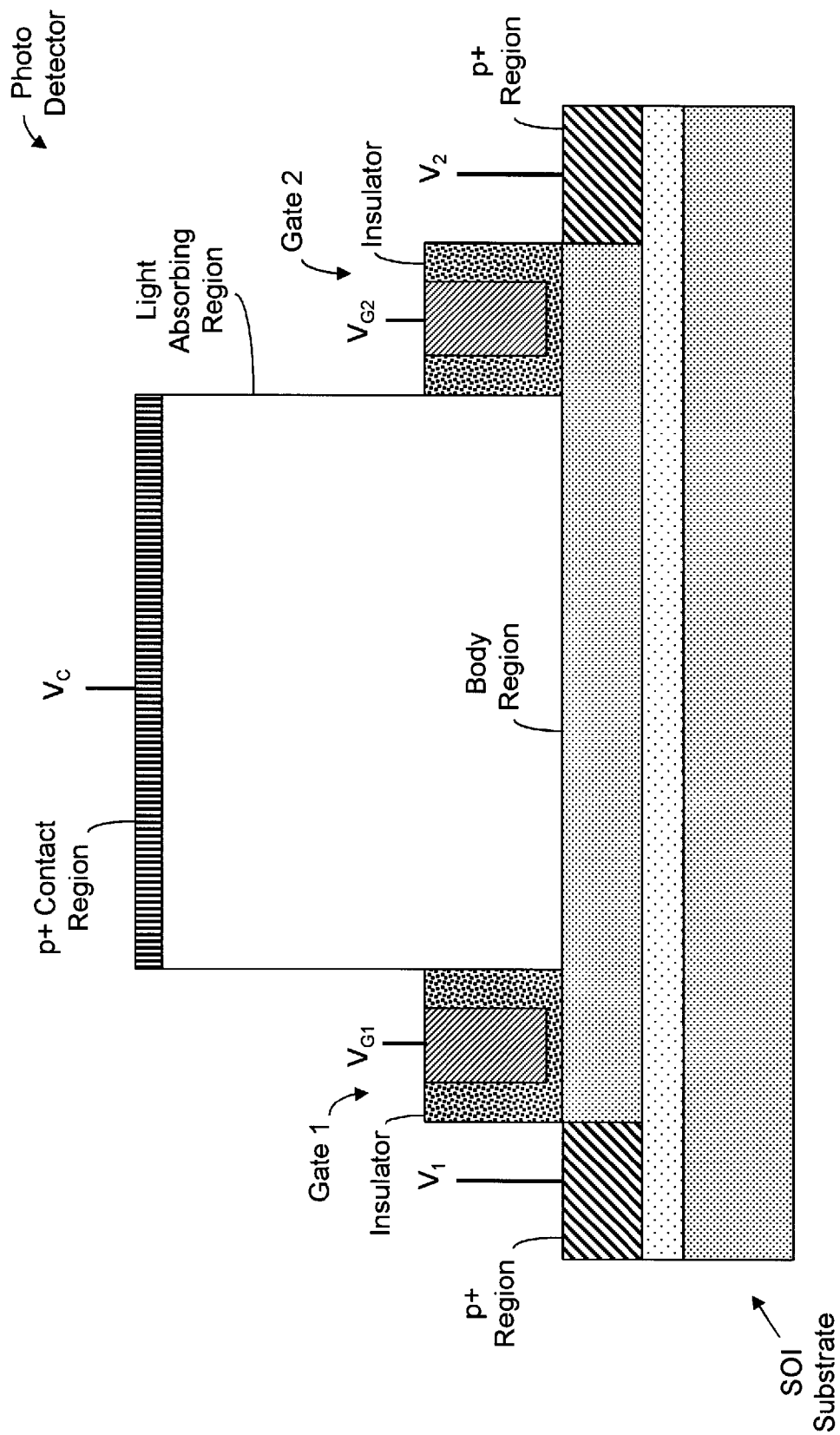
FIGS. 6A and 6B are cross-sectional views of monolithic light sensors or photo detectors according to another aspect of the present inventions wherein the sensor in illustrated embodiment of FIG. 6A is disposed in or on a SOI substrate, for example, a silicon-on-insulator, and in the illustrated the embodiment of FIG. 6B is disposed on a in or on a bulk substrate.

With reference to FIGS. 6A and 6B, a photo detector according to another aspect of the present inventions includes at least one control node or gate (the exemplary cross-sectional view of the photo detector of FIGS. 6A and 6B illustrates two control nodes or gates—see, Gate 1 and Gate 2), a light absorbing region, a body region, and at least one doped impurity region (the exemplary embodiment of FIGS. 6A and 6B again illustrate two doped regions—see p+ Regions) which is disposed in a positional relationship to one or more control nodes or gates. The photo detector also includes a contact region which, in operation, is an output of the photo detector. The photo detector in the exemplary embodiment of FIG. 6A is fabricated in or on a semiconductor on insulator (SOI) substrate (for example, a silicon or germanium region/layer/material disposed on or over an insulator region/layer/material (for example, a silicon oxide, silicon nitride and/or combination thereof). The photo detector in the exemplary embodiment of FIG. 6B may be fabricated on silicon, (for example, a standard bulk silicon), silicon-germanium, gallium-arsenide or an insulator (for example, glass or the like).

Briefly, in one embodiment, the control nodes or gates (hereinafter "gates") may be comprised of a conductive type material (conductor or doped semiconductor), for example, a metal (for example, aluminum or copper), metal compound and/or a doped semiconductor (for example, silicon doped with donor or acceptor impurities). The gates are spaced from the body region via an insulator or dielectric material (for example, silicon oxide, silicon nitride or combinations or composites thereof, for example, ONO).

The body region may be fabricated in or on the substrate. In one embodiment the body region is an intrinsic or doped semiconductor (for example, intrinsic/undoped silicon, germanium or silicon-carbide or a lightly doped (with donor or acceptor impurities) silicon, germanium or silicon-carbide). Indeed, the body region may be one or more materials from the Group IV semiconductor including silicon, germanium, silicon carbide and/or combinations thereof (for example, silicon-germanium). The body may be an intrinsic material or a material having impurities, for example, n-type or p-type material(s).

As noted above, the photo detector includes at least one doped region—see, p+ Regions. The doped semiconductor regions may be disposed and/or formed in or on the substrate and juxtaposed the body region. For example, the p-type semiconductor material may be formed in the substrate by doping the semiconductor with a p-type impurity (for example, boron). Notably, the doped semiconductor regions (p+ Regions) are also control nodes of the photo detector and, in operation, an output of the photo detector.

The light absorbing region, in one embodiment, is disposed and/or formed on the substrate and may be comprised of a material having a high electron mobility, for example, germanium, silicon-germanium or gallium arsenide. In this way, in operation, electrons which are displaced from certain orbitals, in response to impinging light or photons, may more readily or easily move within the light absorbing region.

Figure 6B:
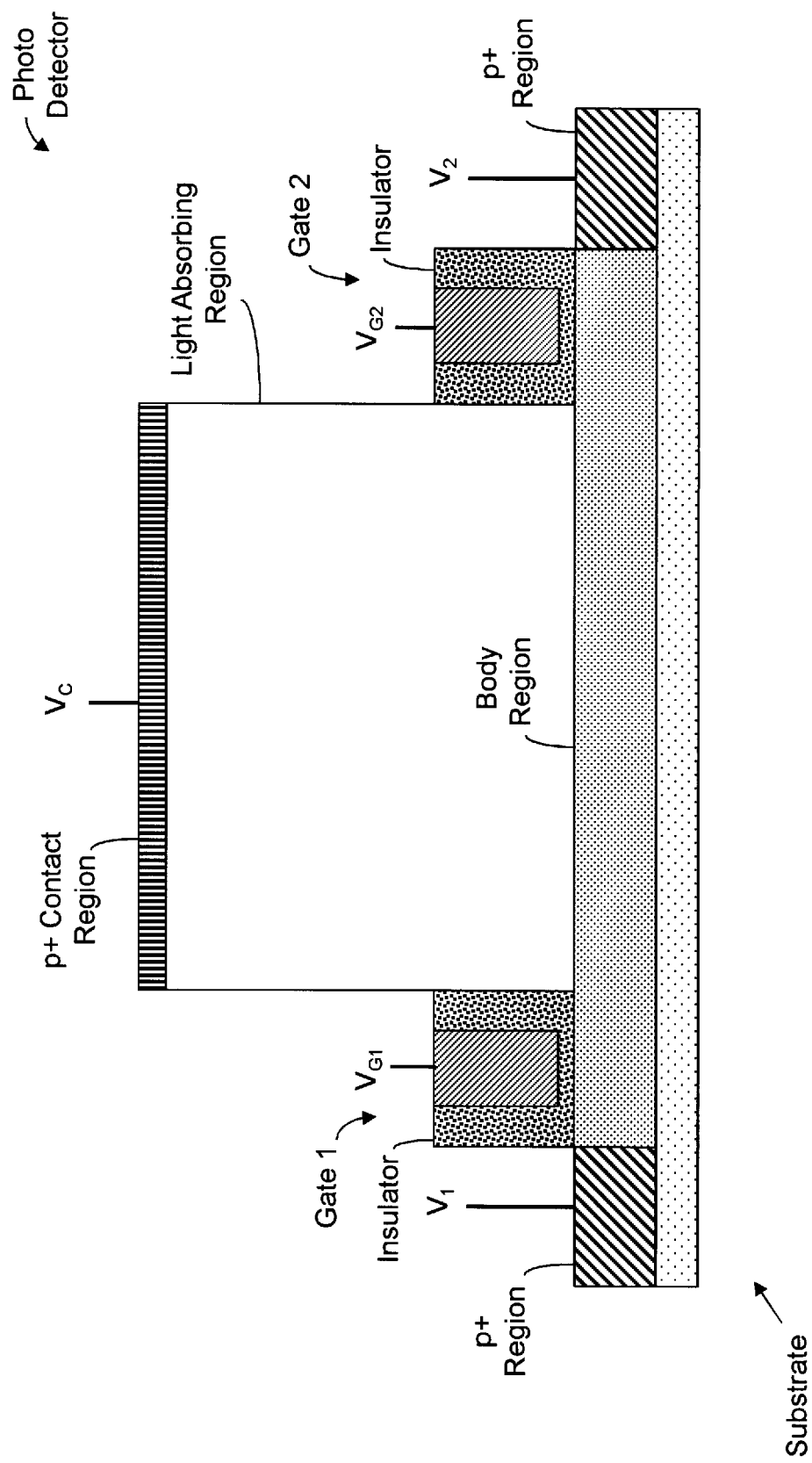

With continued reference to FIGS. 6A and 6B, the contact region is disposed and/or formed on or in the contact region and may be comprised of a conductive type material (conductor or semiconductor), for example, a metal (for example, aluminum or copper), metal compound and/or a doped semiconductor (for example, silicon, silicon-germanium or gallium arsenide doped with donor or acceptor impurities). In one embodiment, the contact region is an acceptor type material such as p-type semiconductor material formed from or by doping a semiconductor with a p-type impurity (for example, boron, germanium, silicon-germanium, silicon-carbide or gallium arsenide. Indeed, in one embodiment, the contact region is a p+ type material consisting of one or more materials from the Group IV semiconductor including silicon, germanium, silicon carbide and/or combinations thereof.

Importantly, the photo detector may be fabricated using any materials and/or techniques now known, described herein, and/or later developed.

Figure 6C:
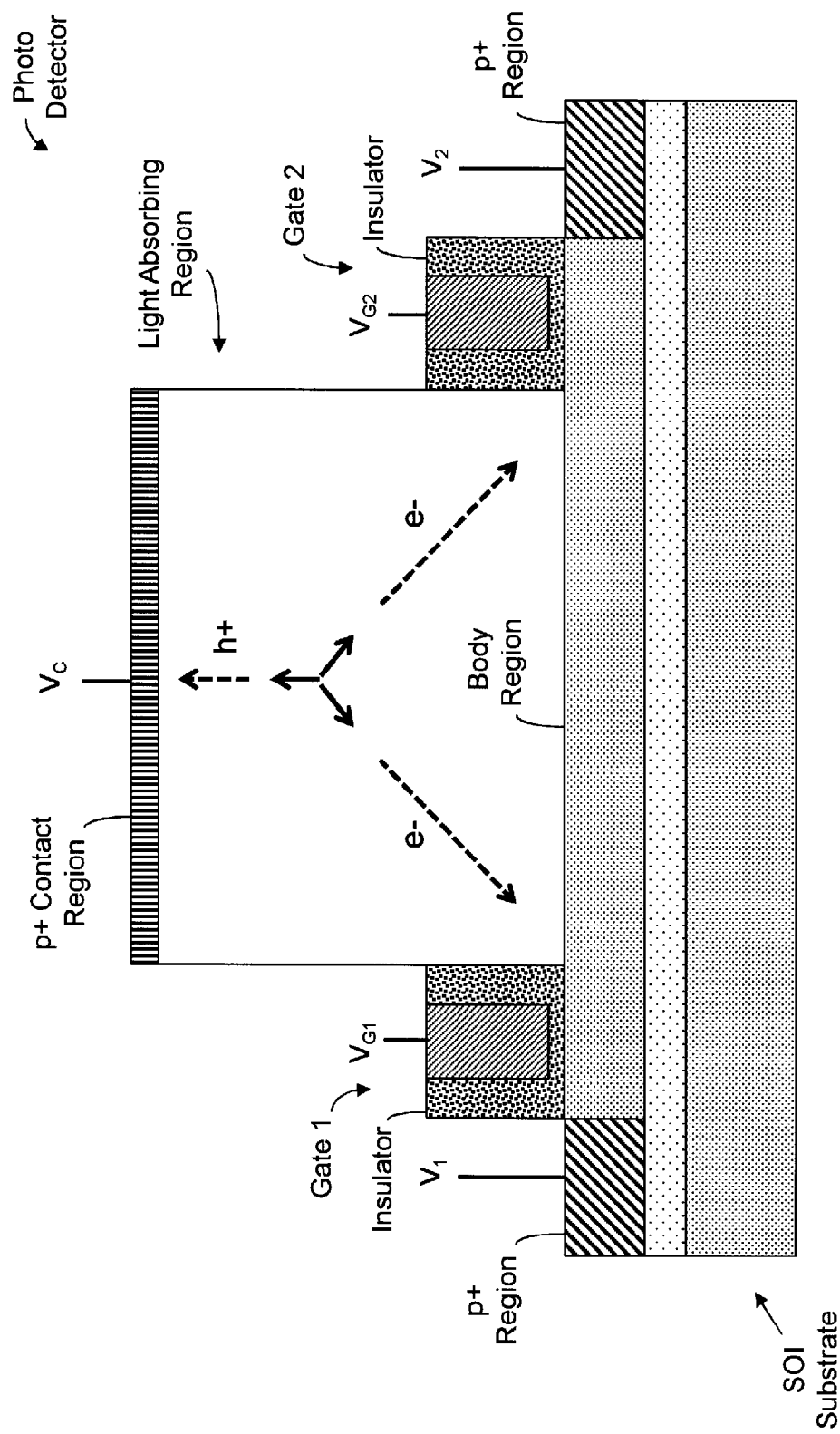
FIGS. 6C-6E are cross-sectional views of the general operation of the light sensors of FIGS. 6A and 6B, in accordance with an aspect of the present inventions, wherein applying selected or predetermined voltages to the gates, the doped regions (in this illustrated embodiment, p+ regions) and contact region (in this embodiment, a p+ contact region) of the light sensor facilitates detection of light incident on the sensor.

With reference to FIG. 6C, in operation, the photo detector detects incident light via application of selected or predetermined voltages to the gates, the doped regions (in this illustrated embodiment, p+ regions) and contact region (in this embodiment, a p+ contact region). In one embodiment, a positive voltage is applied to Gates 1 and 2 (for example, $V_{G1}=V_{G2}=+2V$), a positive voltage is applied to the p+ regions (for example, $V_1=V_2=+1V$), and a negative or ground voltage applied to the p+ contact region (for example, $V_C=0V$). Under these conditions, an electric field forms and some positive carriers (i.e., holes) flow to the contact region and negative carriers (i.e., electrons) flow to the p+ region via the body region. The photo detector is essentially in a non-conductive state wherein a current between the contact region and the p+ regions is quite small.

Figure 6D:
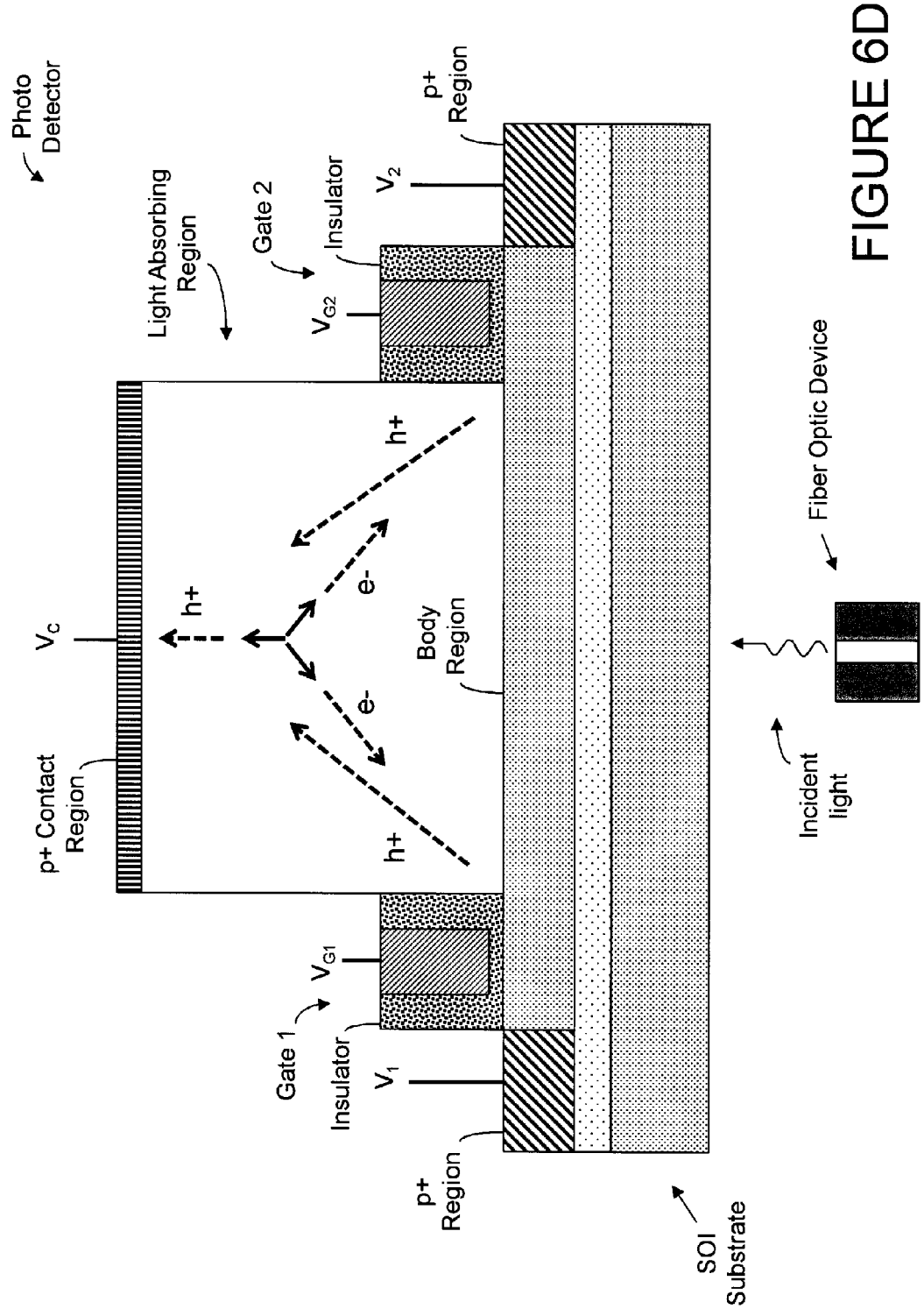
Figure 6E:
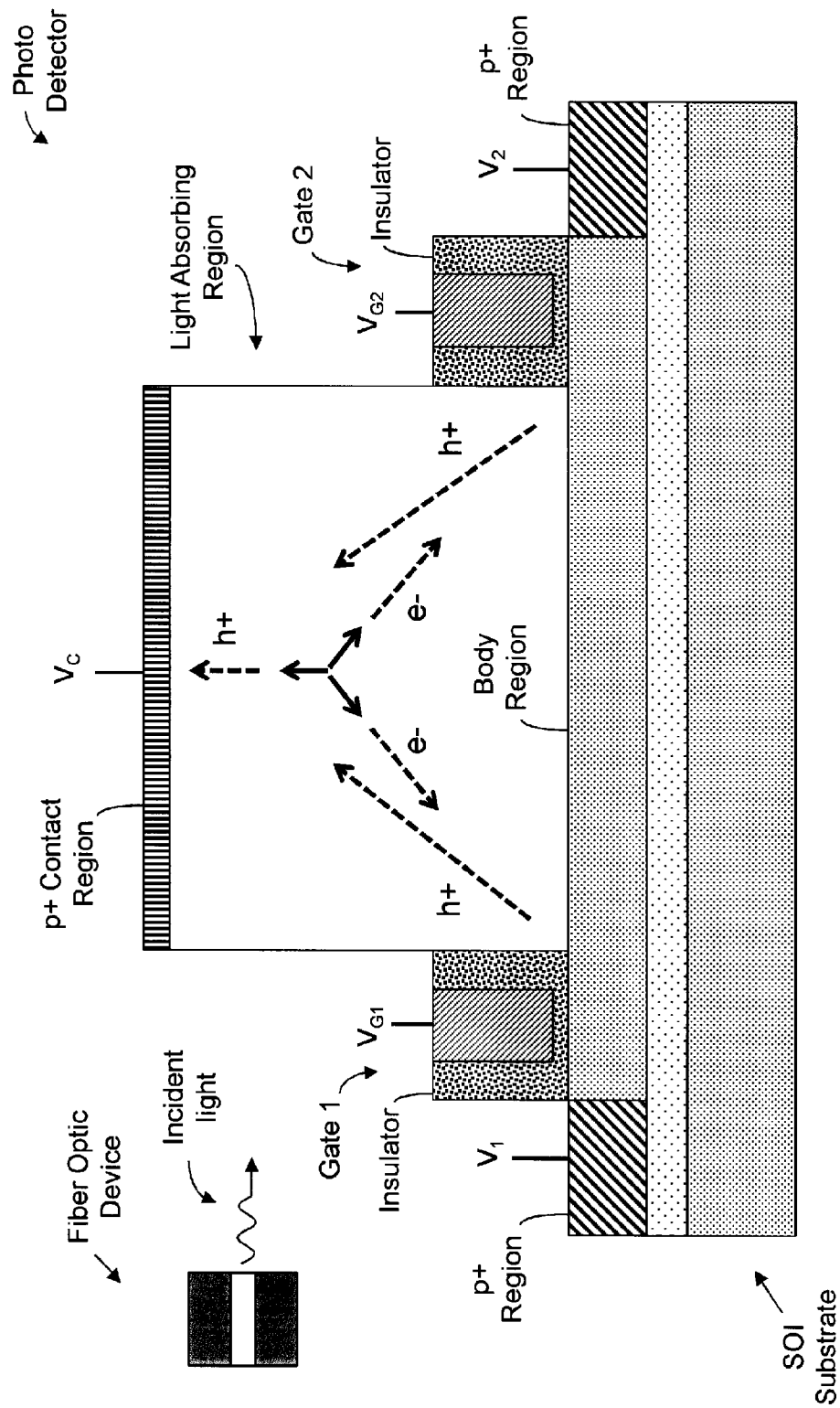

With reference to FIGS. 6D and 6E, in response to light incident on or applied to the light absorbing region of the photo detector (for example, light which is output from a fiber optic device), electron-hole pairs are generated in the light absorbing region (for example, germanium or silicon-germanium). The electron-hole pairs separate, in the presence of the electric field produced or provided by the voltages (for example, static or fixed voltages) applied to the gates, p+ regions and the p+ contact region. In this regard, holes are attracted to and flow to the p+ contact region and electrons are attracted to and flow to the body region and, in particular, to the body region near and/or beneath the gates (i.e., gate 1 and gate 2). That is, the electron-hole pairs are separated by an electric field and the holes flow to the p+ contact region and the electrons flow to portions of the body region near and/or beneath the gates. This induces or causes the potential barrier lowering for holes in the body region located near and/or beneath the gates as excess electrons accumulate in that region. Under these circumstances, an additional and/or greater hole current is created and flows from the p+ regions through a portion of the body region and the light absorbing region to the p+ contact region thereby increasing the magnitude of the output current.

Thus, negative carriers (i.e., electrons) accumulate beneath the gates and, in response thereto, positive carriers (i.e., holes) from the p+ regions juxtaposed the gates, flow to the contract region (here a p+ contact region). In this way, the photo detector is in a conductive state or mode, which provides a large internal current gain. The current flows between the p+ regions and the contact region and an output current upon detecting or in response to the incident light.

Notably, in the absence of incident light, little to no current flows between the p+ regions and the contact region due to the barrier caused or provided by the voltages applied to the gates. Moreover, the photo detector may be disabled via removing/changing the voltages applied to one or more of Gates 1 and 2, contact region, p+ regions, and/or applying voltages of opposite polarity to one or more of one or more of Gates 1 and 2, contact region, p+ regions. For example, decreasing the voltages applied to the gates and/or p+ regions may place the photo detector in a non-conductive state.

The illustrated/exemplary voltage levels to implement or enable sensing by the photo detector are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the voltages applied to Gates 1 and 2, p+ regions and/or contact region become or are positive and negative.

Moreover, like that described in the previous embodiments, the detection time of the photo detectors of the present inventions may be programmable or tunable, for example, to meet or accommodate response time specifications as well as power consumption specification. In one embodiment, the voltages applied to the gates are adjusted to increase the response time of the photo detector (for example, by increasing the electric field). In another embodiment, the voltages applied to the gates are adjusted to reduce the power consumption of the photo detector. Thus, the response time and/or power consumption may be adjusted, for example, to accommodate desired/required specifications. All permutations response time and/or power consumption, and combinations of thereof, are intended to fall within the scope of the present inventions.

In addition thereto, or in lieu thereof, in one embodiment, the photo detector is placed in a predetermined state before sensing the light (or data). For example, carriers may be removed from the body region prior to sensing so that the concentration of carriers in the body region (and near and/or beneath the gates) at the initiation of sensing is below a predetermined value. In one embodiment, the photo detector is placed in a predetermined state by applying predetermined voltages to the p+ regions and applying voltage pulses to the gates to remove carriers from the body region thereby providing depletion regions under gates Gate 1 and Gate 2. Establishing the photo detector in a predetermined state (for example, periodically) before sensing may increase or enhance the stability, response time and/or accuracy of the photo detector during sensing/operation.

Figure 7A:
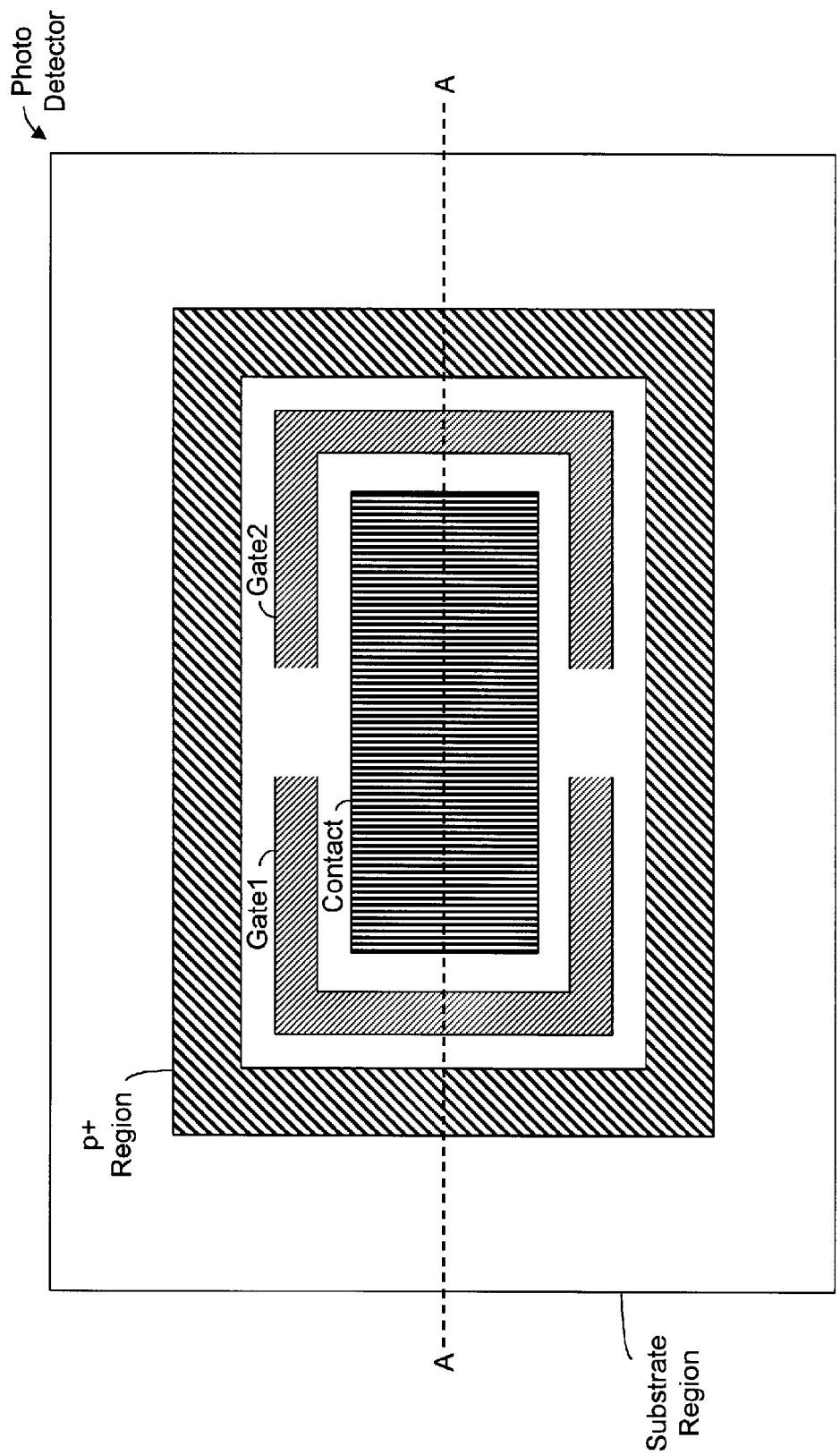
FIGS. 7A-7C illustrate exemplary top views of the cross-sectional views of the sensors of FIGS. 6A-6C wherein dotted lines A-A indicate the location of the cross-sectional views of FIGS. 6A-6C; notably, with respect to FIG. 7C, gates 1 and 2 are interconnected as a unitary structure which is identified or designated "Gate"
Figure 7B:
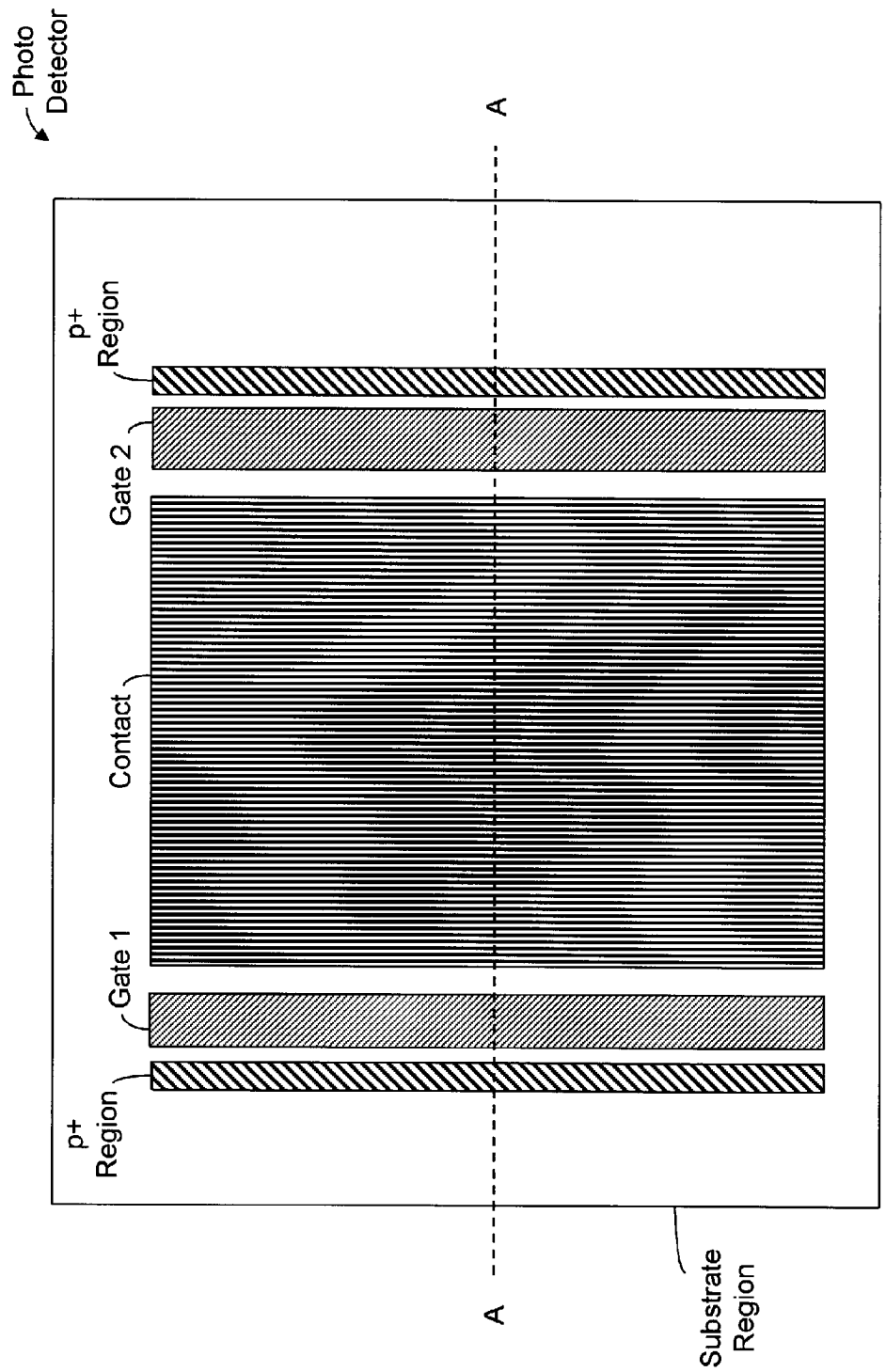
Figure 7C:
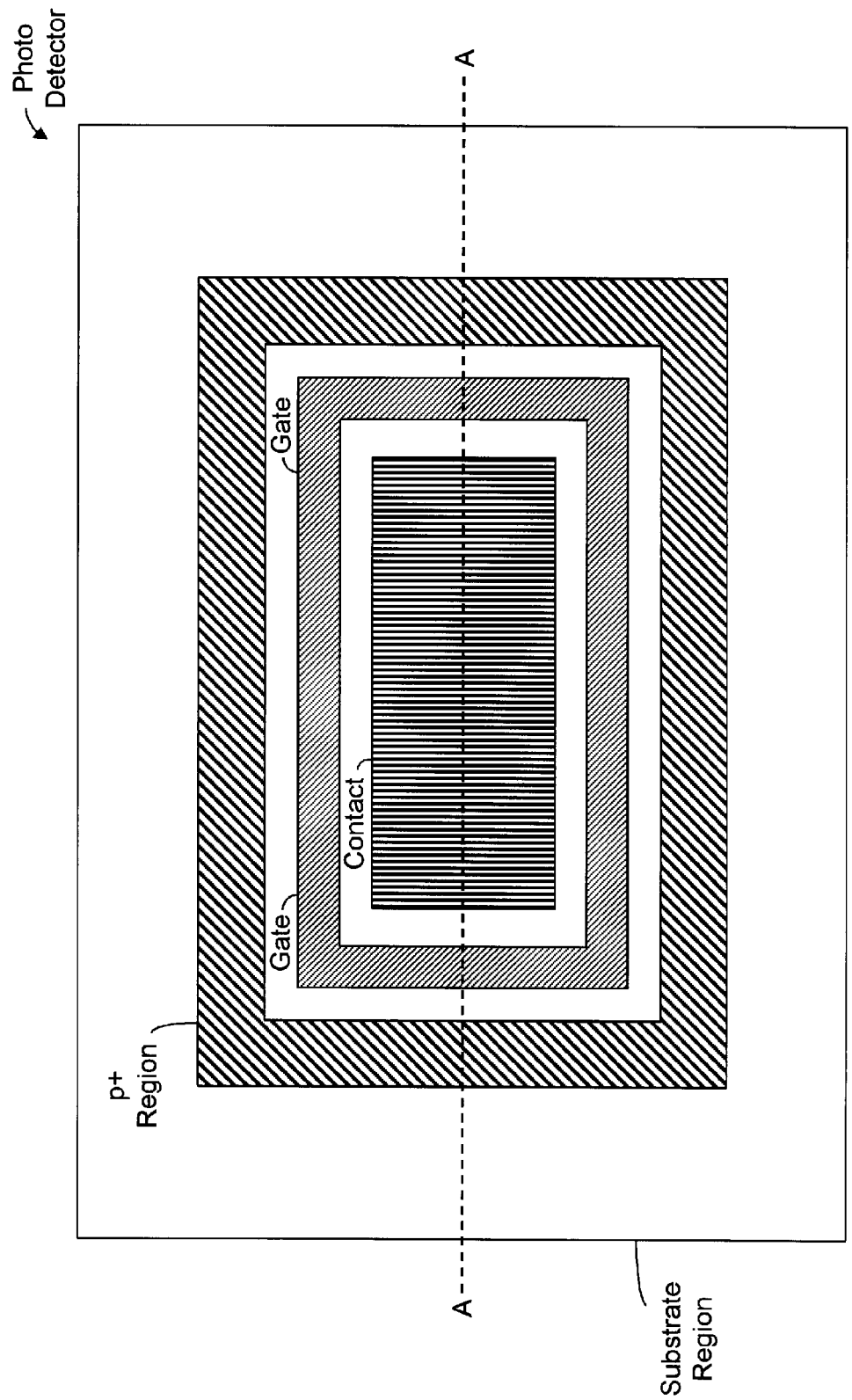

Notably, FIGS. 7A-7C illustrate exemplary top views of the cross-sectional views of the photo detectors of FIGS. 6A-6C wherein dotted lines A-A indicate the location of the cross-sectional views of FIGS. 6A-6C. With respect to FIG. 7C, the gates 1 and 2 are interconnected as one structure.

Figure 8A:
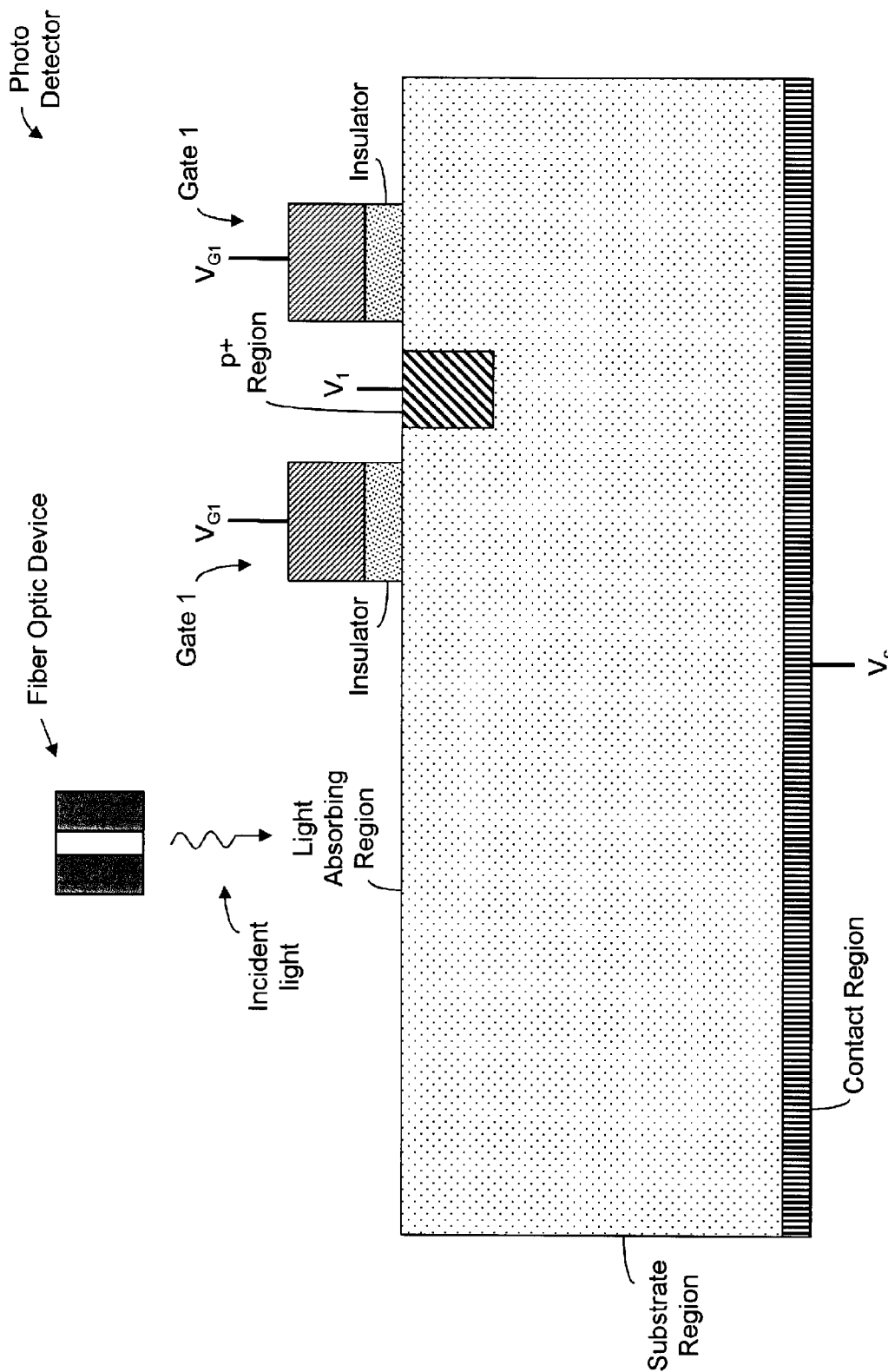
FIG. 8A is a cross-sectional view of a monolithic light sensor or photo detector according to another aspect of the present inventions wherein the contact region of this illustrative light sensor is disposed on a backside of the bulk substrate wafer/die.

With reference to FIG. 8A, in another embodiment, the photo detector includes a contact region disposed on a backside surface of the substrate region (for example, the major surface which is opposing the major surface upon which the p+ region and gates are disposed). In this embodiment, the primary light absorbing region is a portion of the substrate region which, in an exemplary embodiment, may be silicon (for example, a low doped p-type silicon substrate), silicon-germanium or gallium-arsenide or combinations thereof (for example, both germanium and gallium-arsenide). Here, the light absorbing region is a material which facilitates generation of carriers in response to incident light. The light absorbing region may be a doped or undoped material (for example, a highly doped semiconductor material (for example, highly doped silicon) which is more responsive to photons than a similar undoped or a lightly doped semiconductor material).

In this embodiment, in response to incident light, electrons and holes are created in the light absorbing region and are separated in the presence of an electric field produced or provided by the voltages (for example, static or fixed voltages) applied to the p+ region (for example, $V_1$=+3V), gates (for example, greater than $V_{G1}$=+4V) and the contact region (a negative or ground voltage, $V_C$=0V) wherein, in this exemplary embodiment, the contact region is a p+ type contact region. Under these circumstances, the holes flow to the p+ contact region and electrons flow to the body region and, in particular, to the body region near and/or beneath the gates (i.e., Gate 1). Like that described above, as excess electrons accumulate in the body region located near and/or beneath the gates, the electron barrier (band gap) is lowered therein. This results in an additional and/or greater hole current flow from the p+ regions through a portion of the substrate region to the contact region. The operation of the photo detector of FIG. 8A is substantially the same as described above with respect to the photo detector of FIGS. 6A and 6B. For the sake of brevity, that discussion will not be repeated.

Figure 8B:
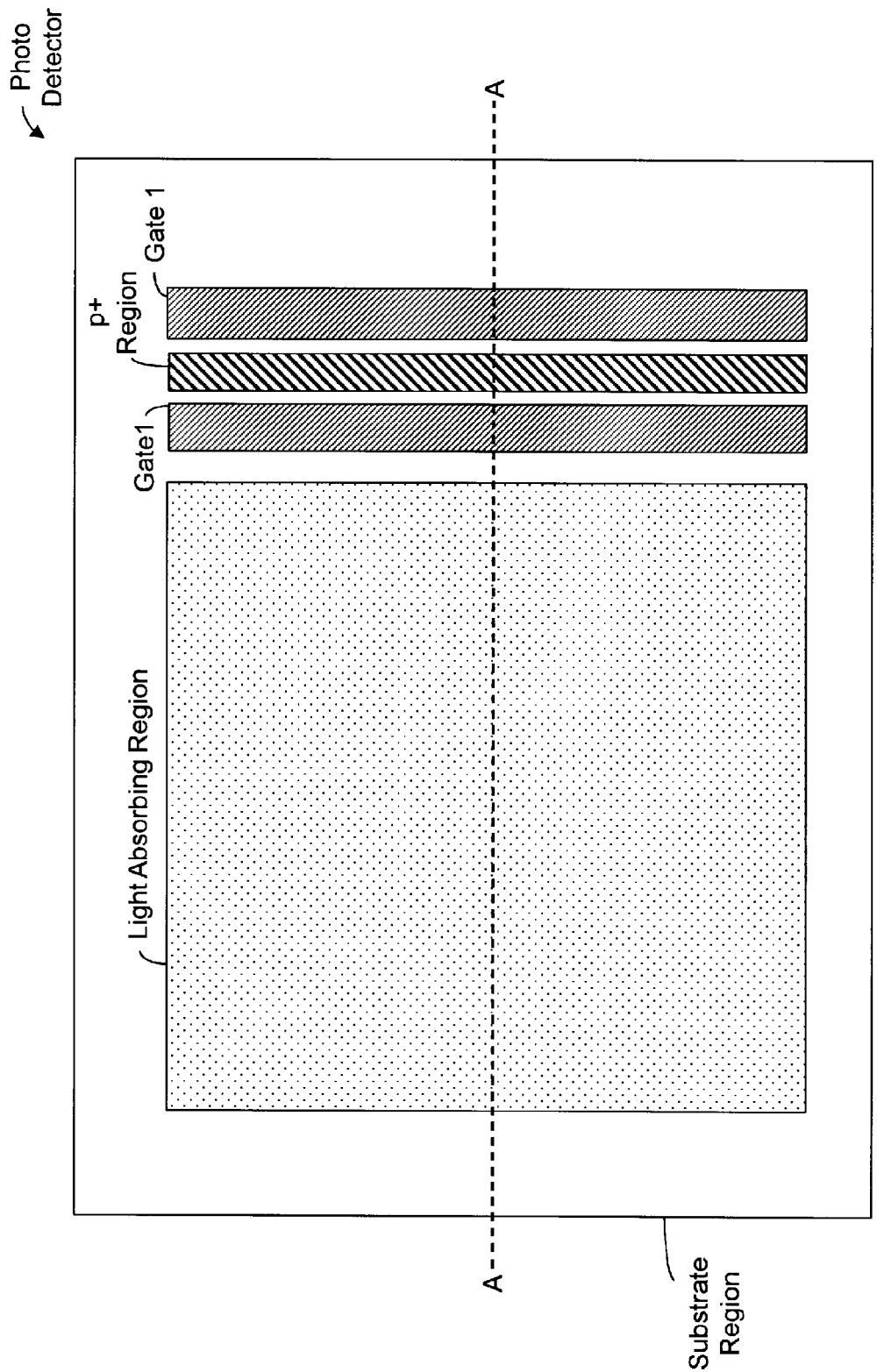
FIGS. 8B and 8C illustrate exemplary top views of the cross-sectional view of the sensor of FIG. 8A wherein dotted lines A-A indicate the location of the cross-sectional view of FIG. 8A.
Figure 8C:
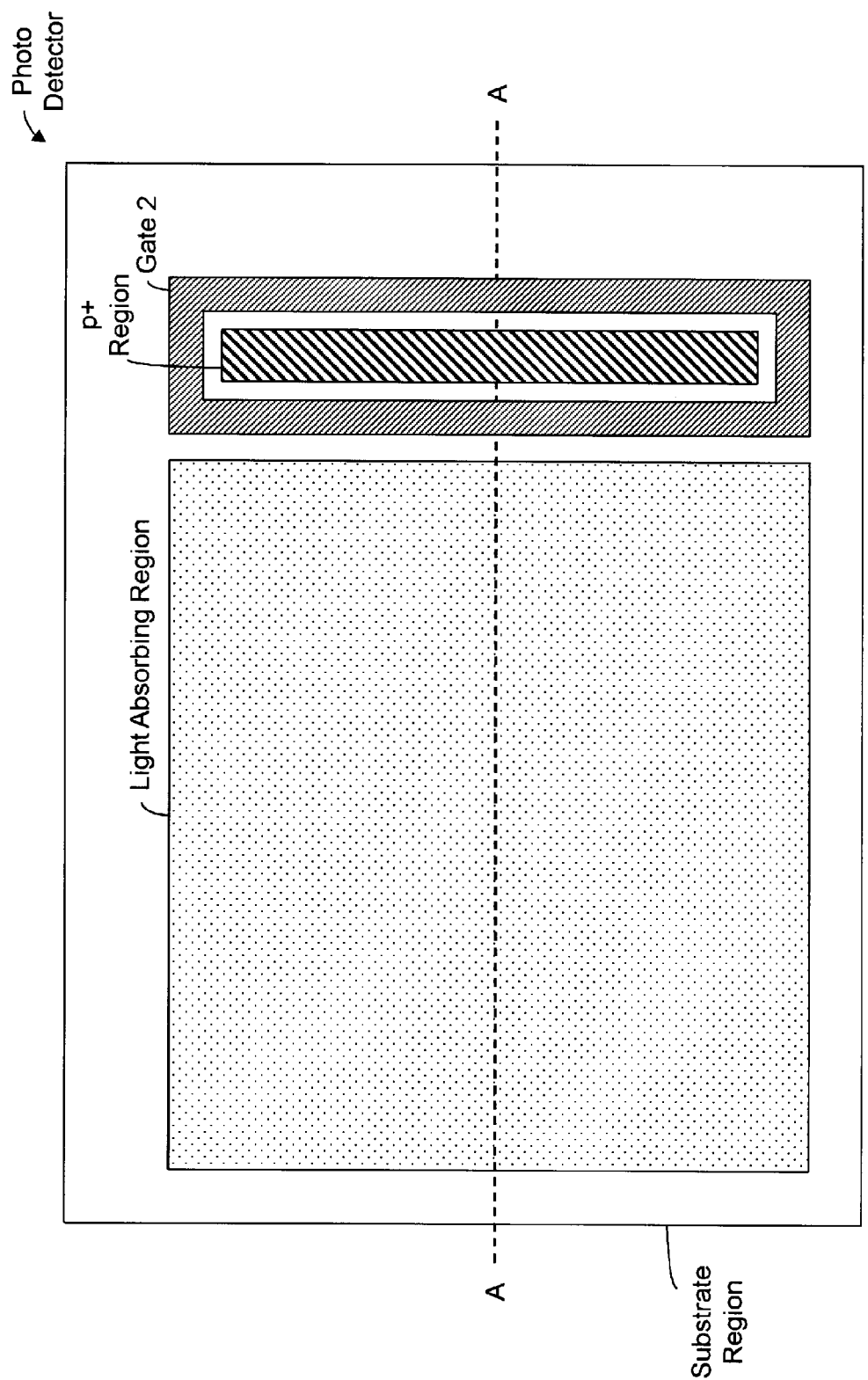

Notably, the materials and configuration of the gates and the doped region (p+ region) may be the same as that described in connection with the embodiment of FIGS. 6A and 6B. Moreover, FIGS. 8B and 8C illustrate exemplary top views of the cross-sectional views of the photo detectors of FIG. 8A wherein dotted lines A-A indicate the location of the cross-sectional views of FIG. 8A.

In one embodiment, the exemplary photo detector of FIG. 8A may include two or more p+ region, each p+ region having associated gates. For example, with reference to FIG. 9A, in yet another embodiment, the photo detector of the present inventions includes at least two doped regions (p+ regions) each having a positional relationship to associated gates or control nodes—namely, gate 1 and gate 2, respectively. The materials and configuration of the gates and the doped region (p+ region) may be the same as that described in connection with the embodiment of FIGS. 6A, 6B and 8A. For the sake of brevity, that discussion will not be repeated.

Figure 9A:
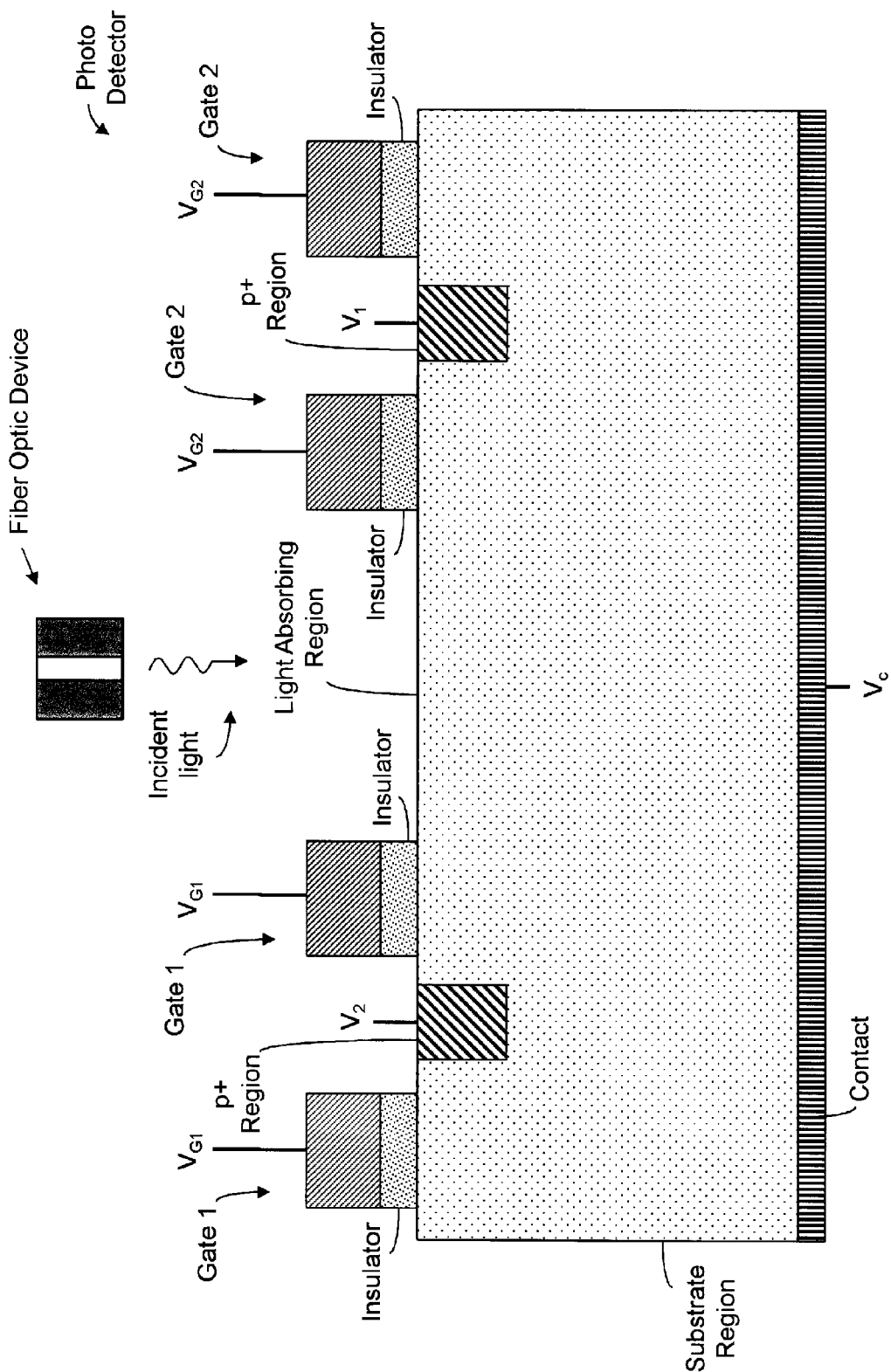
FIG. 9A is a cross-sectional view of a monolithic light sensor or photo detector according to yet another aspect of the present inventions.

Moreover, the operation of the photo detector of FIG. 9A is substantially the same as described above with respect to the photo detector of FIG. 8A. That is, in response to incident light, electrons and holes are created in the light absorbing region and are separated in the presence of an electric field produced or provided by the voltages (for example, static or fixed voltages) applied to the p+ region (for example, +3V), gates (for example, greater than +4V) and the contact region (a negative or ground voltage). As excess electrons accumulate in the substrate region located near and/or beneath the gates, the potential barrier for holes lowers in that region thereby providing for a hole current which flows from the p+ regions to the contact region. Notably, in this exemplary embodiment, the contact region is again a p+ type contact region.

Figure 9B:
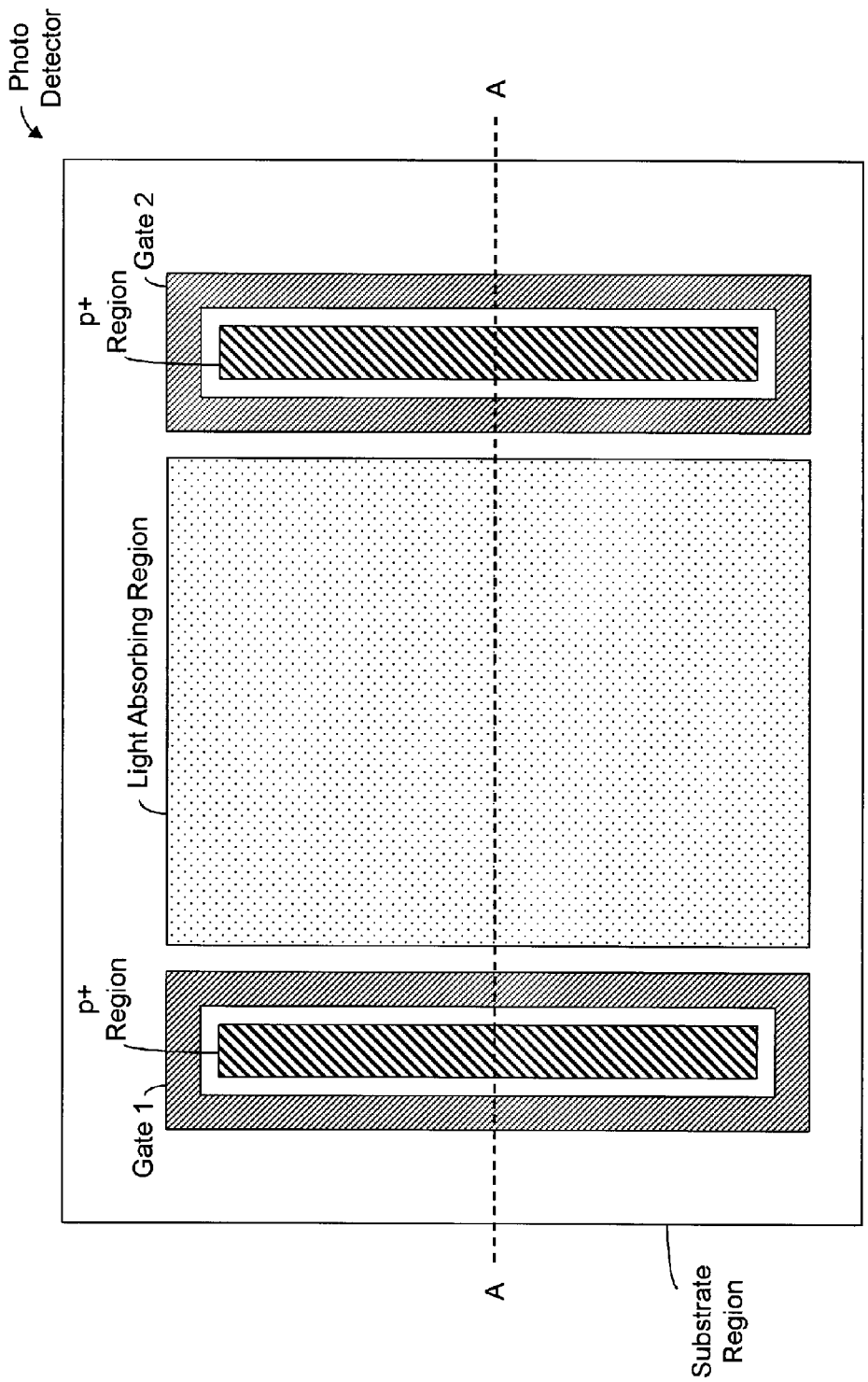
FIGS. 9B-9D illustrate exemplary top views of the cross-sectional view of the light sensor of FIG. 9A wherein dotted lines A-A indicate the location of the cross-sectional view of FIG. 9A; notably, with respect to FIG. 9D, gates 1 and 2 are interconnected as a unitary structure which is identified or designated "Gate"
Figure 9C:
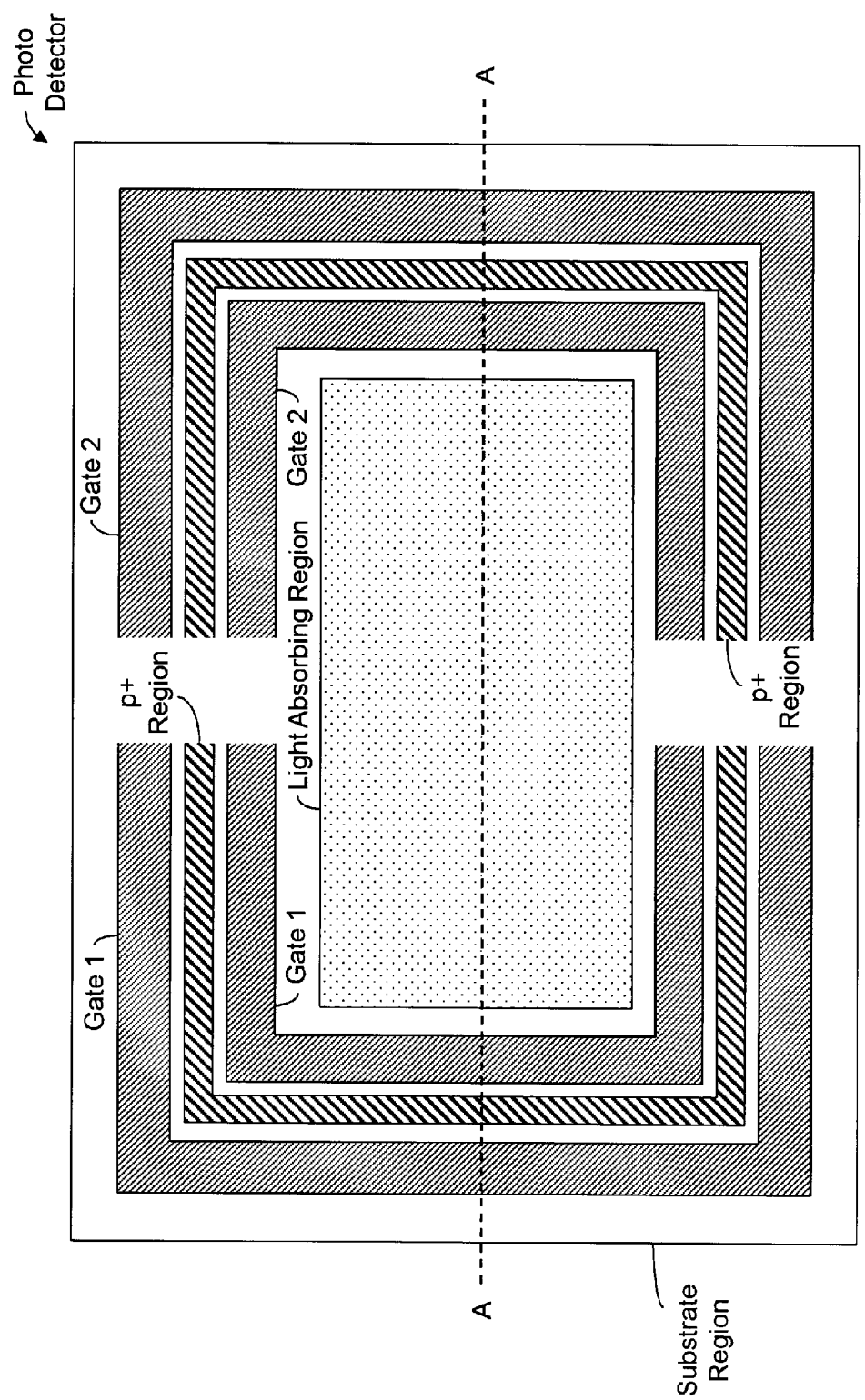
Figure 9D:
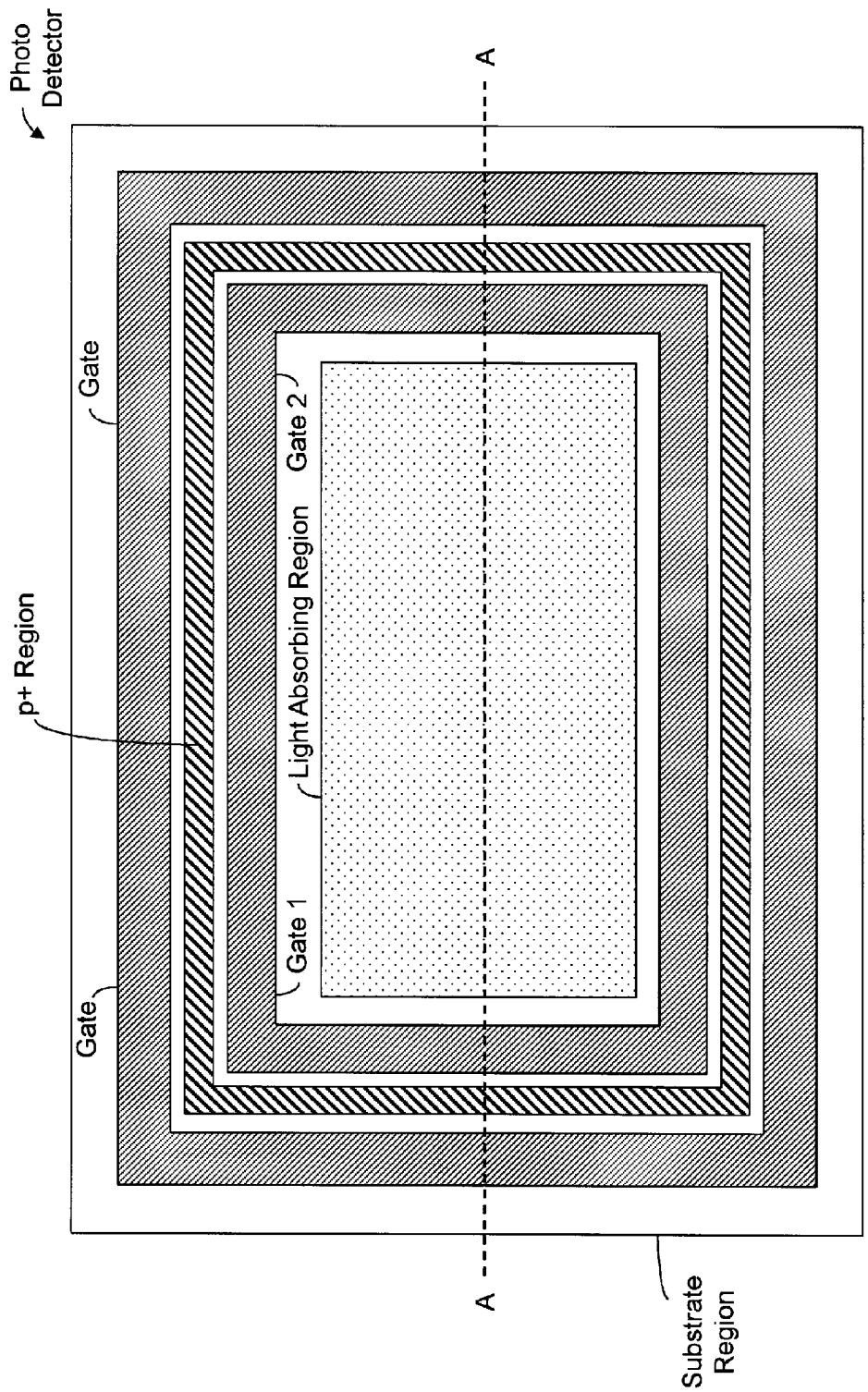

FIGS. 9B and 9C illustrate exemplary top views of the cross-sectional views of the photo detectors of FIG. 9A wherein dotted lines A-A in FIGS. 9B and 9C indicate the location of the cross-sectional views of FIG. 9A. With respect to FIG. 9D, gates 1 and 2 may be interconnected as one structure.

Notably, the exemplary photo detector illustrated in FIG. 9A, relative to the photo detector illustrated in FIG. 8A, may generate a larger current in response to incident light. That is, the plurality of p+ regions (having associated gates juxtaposed thereto) may in combination generate a larger current in response to incident light. Moreover, the photo detector embodiment of FIG. 9A may be employed as a "building block" of an array of photo detectors of a photo detector device wherein the gates are electrically connected and the outputs are connected in parallel. Indeed, all of the embodiments herein may be employed as "building blocks" of an array of photo detectors of a photo detector device. In the embodiment of FIG. 9A, it is preferable that substrate is low doped and an electric field exists in the region between the contact region and the P+ regions.

In another embodiment, the contact region is disposed and/or formed in the substrate region and on the major surface containing the p+ region(s) and the gates. For example, with reference to FIG. 10A, the contact region may be a formed/disposed in and/or from the substrate region. In one embodiment, the contact region is formed in the substrate region (for example, via conventional lithographic, etching and deposition techniques) and is comprised of a conductive type material (conductor or semiconductor), for example, a metal (for example, aluminum or copper), metal compound and/or a doped semiconductor (for example, silicon, silicon-germanium or gallium arsenide doped with donor or acceptor impurities). The contact region may be an acceptor type material such as p+ doped silicon, germanium, silicon-germanium, silicon-carbide or gallium arsenide.

Indeed, in one embodiment, the contact region is a p+ type material consisting of one or more materials from the Group IV semiconductor including silicon, germanium, silicon carbide and/or combinations thereof.

In another embodiment, the contact region is formed from a portion of the substrate region. For example, in one embodiment, using conventional lithographic and deposition techniques, the substrate may be doped with acceptor type dopants forming, for example, p+ doped silicon, germanium, silicon-germanium, silicon-carbide or gallium arsenide. In one embodiment, the dopant may be boron or aluminum to provide or incorporate atoms (acceptors) into a selected portion of the substrate region in order to increase the number of free charge carriers (in this case positive carriers or holes).

Notably, the substrate region photo detector in the exemplary embodiment may be a semiconductor on insulator (SOI) substrate (for example, a silicon or germanium region/layer/material disposed on or over an insulator region/layer/material (for example, a silicon oxide, silicon nitride and/or combination thereof) or a silicon, (for example, a standard bulk silicon), silicon-germanium, gallium-arsenide and/or combination thereof. Moreover, the materials and configuration of the gates and the doped region (p+ region) may be the same as that described in connection with the embodiment of FIGS. 6A, 1B, 3A and 4A. For the sake of brevity, that discussion will not be repeated.

Figure 10A:
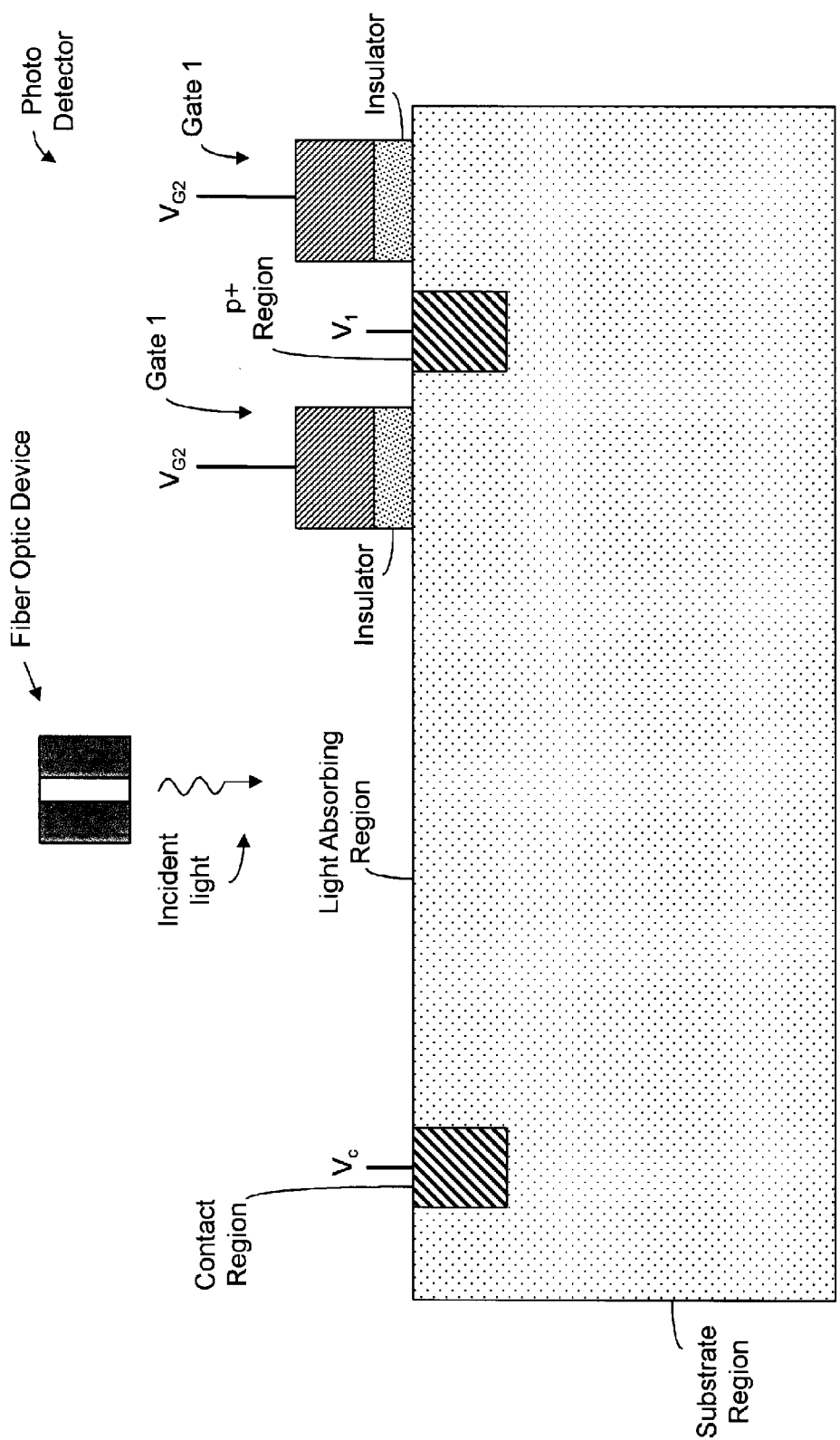
FIG. 10A is a cross-sectional view of a monolithic light sensor or photo detector according to another aspect of the present inventions wherein the contact region of this illustrative sensor is disposed on a top side of the bulk substrate wafer/die.

The operation of the exemplary photo detector of FIG. 10A is substantially the same as described above with respect to the photo detector of FIGS. 8A and 9A. That is, in response to incident light, electron-hole pairs form and are separated by an electric field (formed by applying selected voltages to the contact region (for example, a negative voltage), gates (for example, greater than 4V) and p+ region (for example, 3V)) wherein positive carriers (i.e., holes) flow to the p+ contact region and the negative carriers (i.e., electrons) flow to portions of the body region near and/or beneath the gates. Electrons accumulate near and/or beneath the gates and, in response thereto, positive carriers (i.e., holes) from the p+ region juxtaposed the gates, flow to the contract region (here a p+ contact region). In this way, the photo detector is in a conductive state or mode which provides a large internal current gain. The current flows between the p+ region and the contact region and an output current upon detecting or in response to the incident light.

Figure 10B:
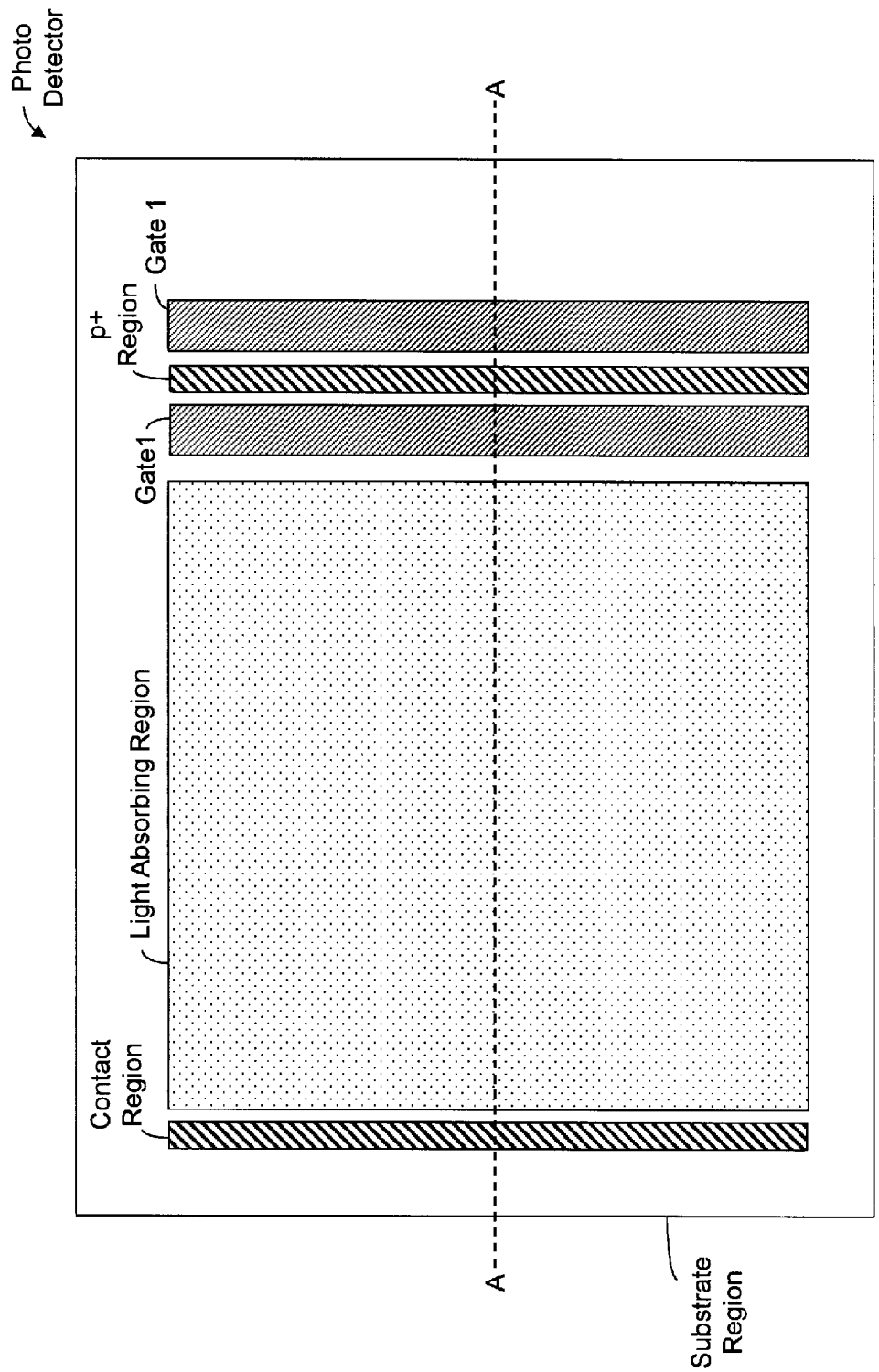
FIGS. 10B and 10C illustrate exemplary top views of the cross-sectional view of the light sensor of FIG. 10A wherein dotted lines A-A indicate the location of the cross-sectional view of FIG. 10A.
Figure 10C:
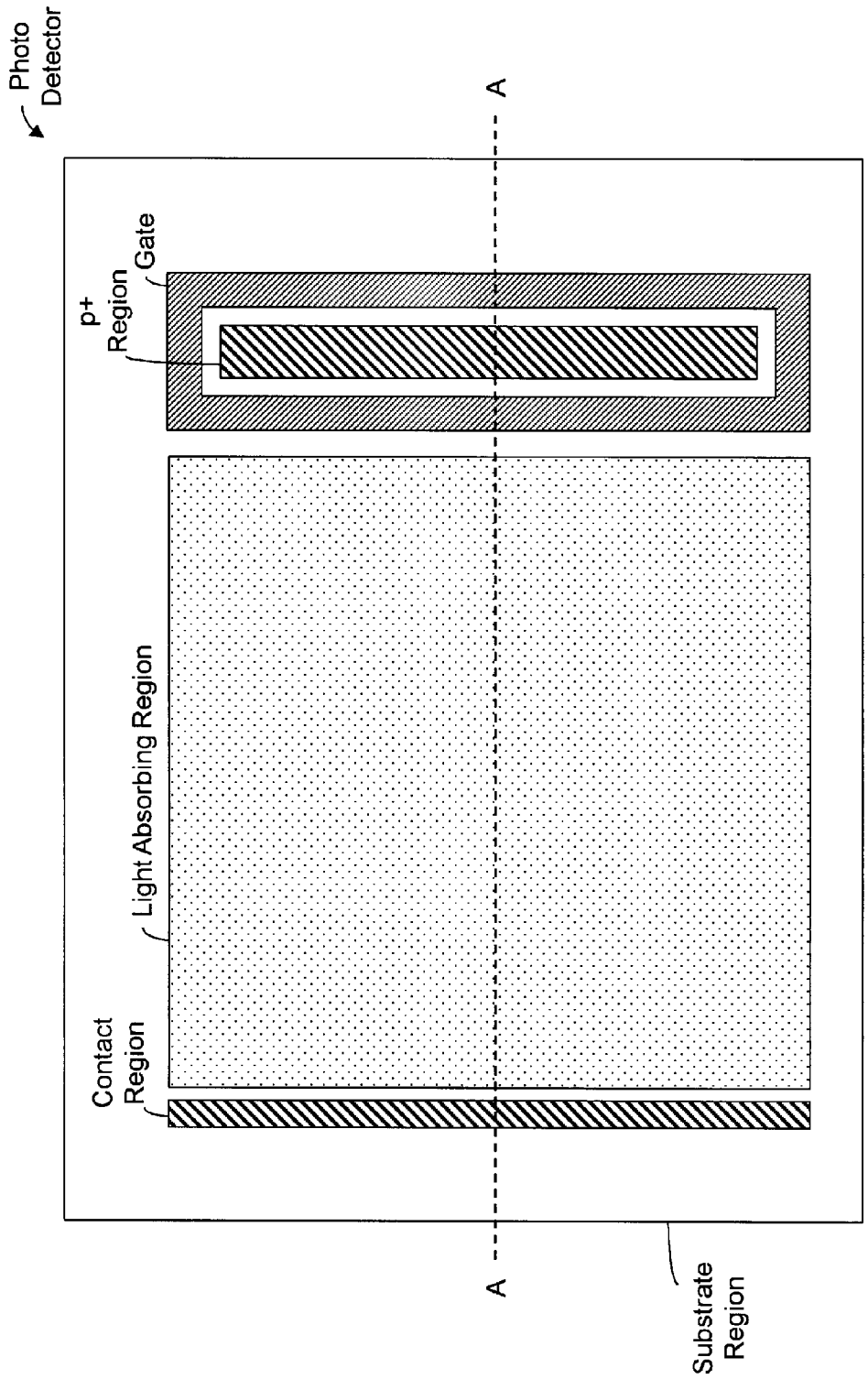

Notably, FIGS. 10B and 10C illustrate exemplary top views of the cross-sectional views of the photo detectors of FIG. 10A wherein dotted lines A-A in FIGS. 10B and 5C indicate the location of the cross-sectional views of FIG. 10A.

Although the contact regions of the aforementioned embodiments have often been described as a p+ region, in another embodiment, the contact region may be an n-F type.

Figure 11A:
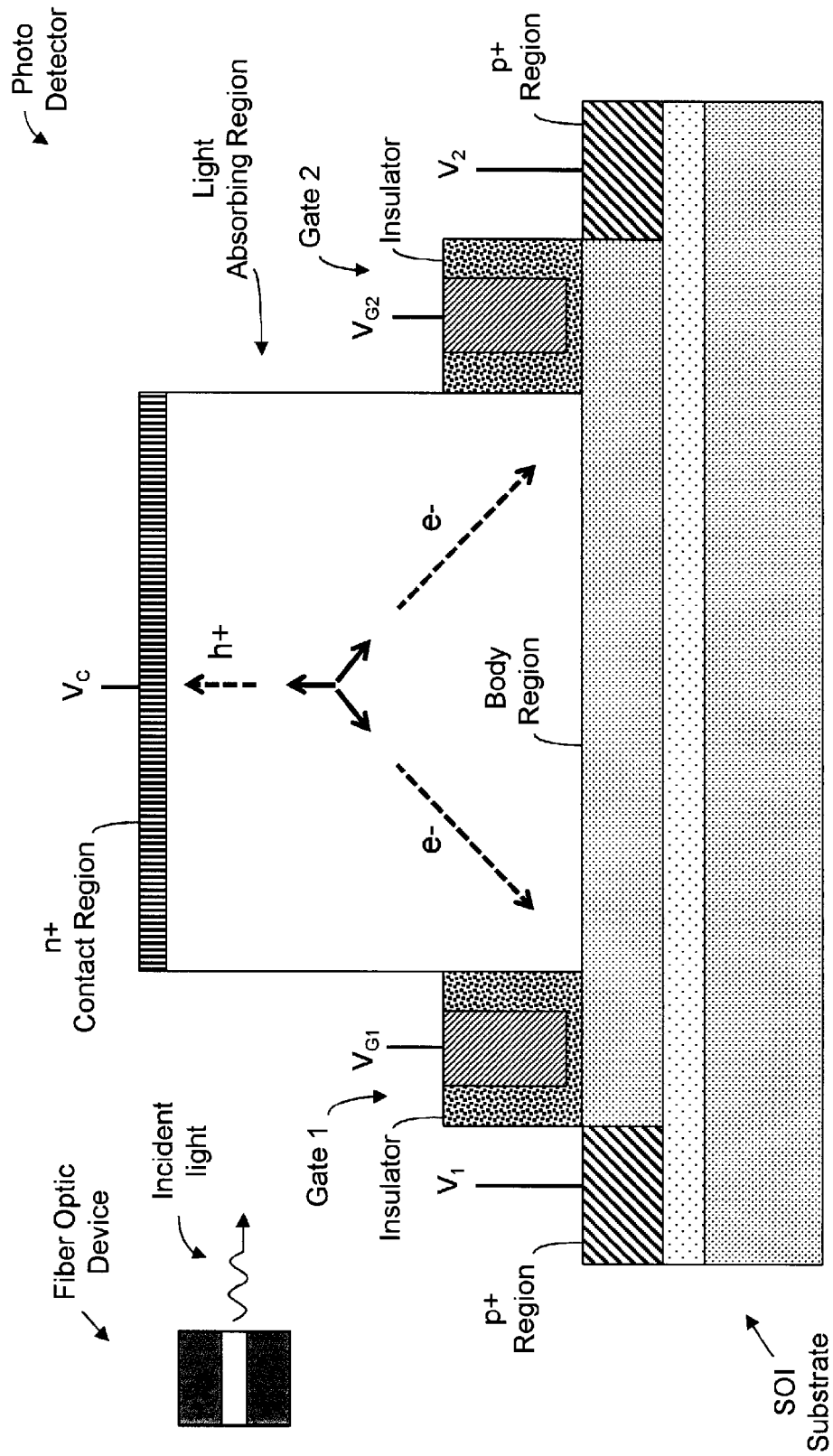
FIGS. 11A and 11B are cross-sectional views of monolithic light sensors or photo detectors according to another embodiment of the light sensors of illustrated in FIGS. 6A and 6B, respectively, wherein in this embodiment the contact regions are n+ type material; notably, where the contact region of the embodiment of FIG. 11A or 11B is an n+ type contact region, the sensor may be characterized as an n+pnp+ type structure and the materials, processing, architecture and layout of the sensor may be the same as those of the embodiment of FIGS. 6A and 6B except for the n+ contact region.
Figure 11B:
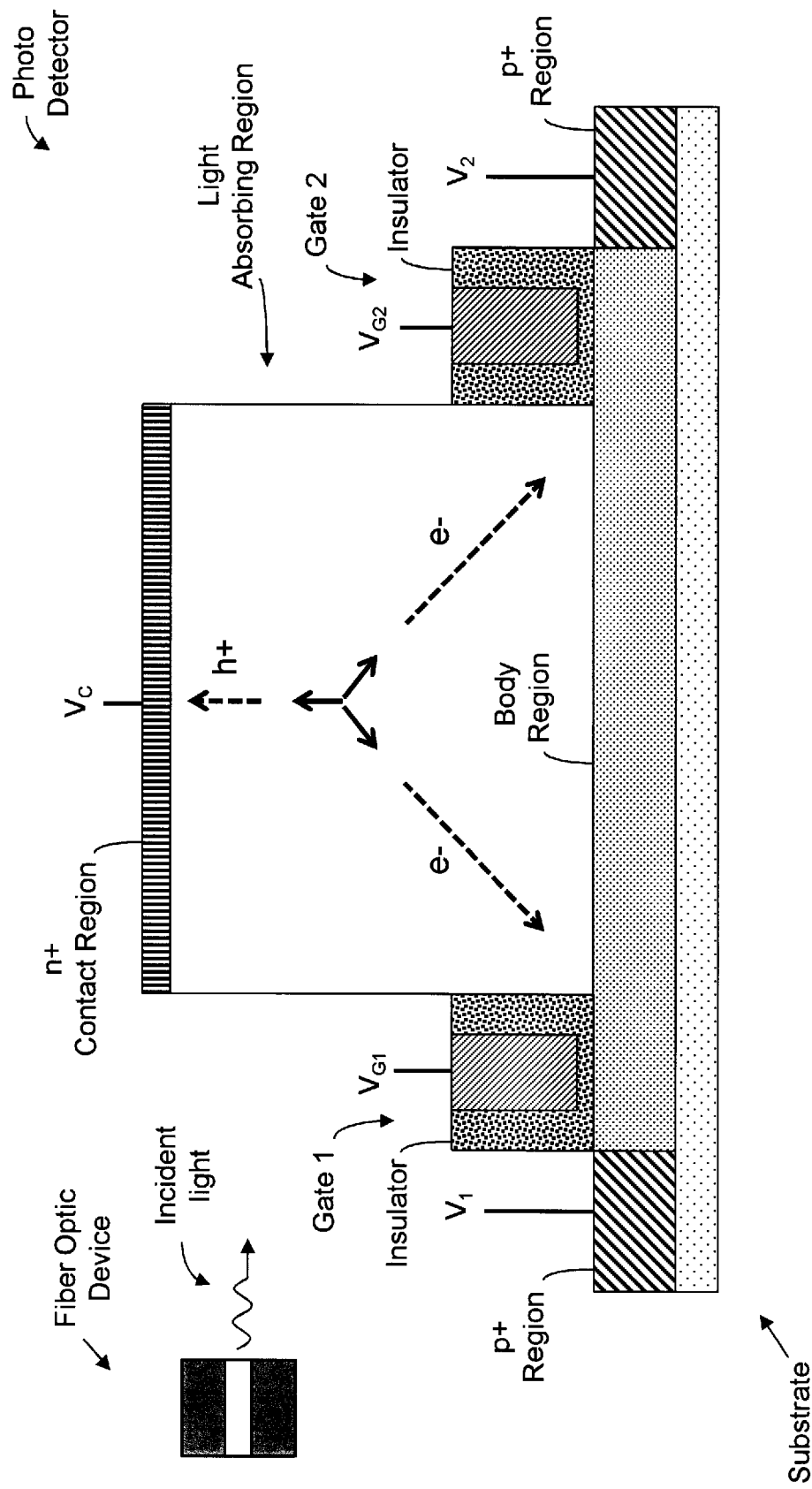
Figure 11C:
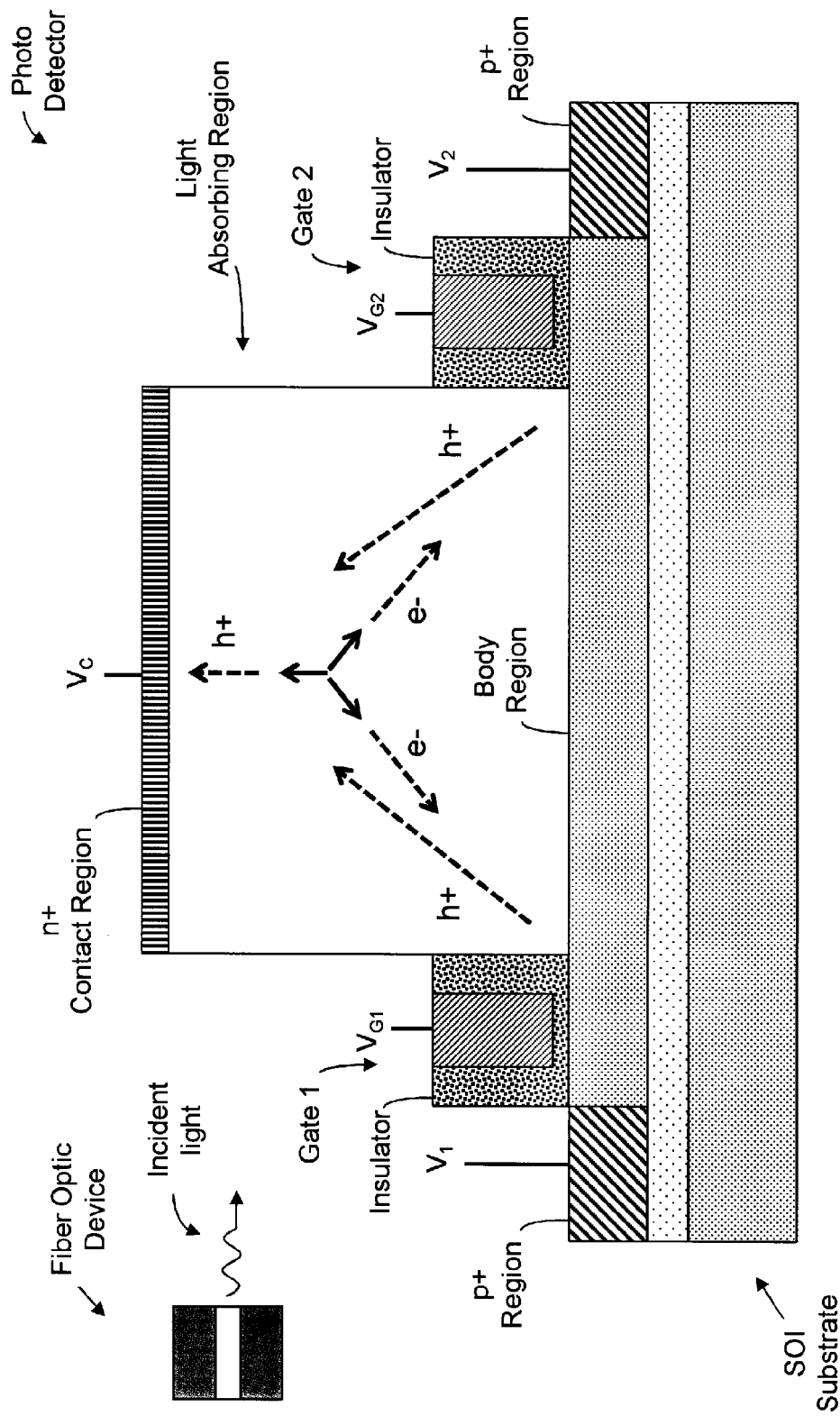
FIGS. 11C and 11D are cross-sectional views of the general operation of the sensors or detectors of FIGS. 11A and 11B, in accordance with an aspect of the present inventions, wherein the sensor detects incident light via application of selected or predetermined voltages to the gates, the doped regions (in this illustrated embodiment, p+ regions) and contact region (in this embodiment, a p+ contact region)
Figure 11D:
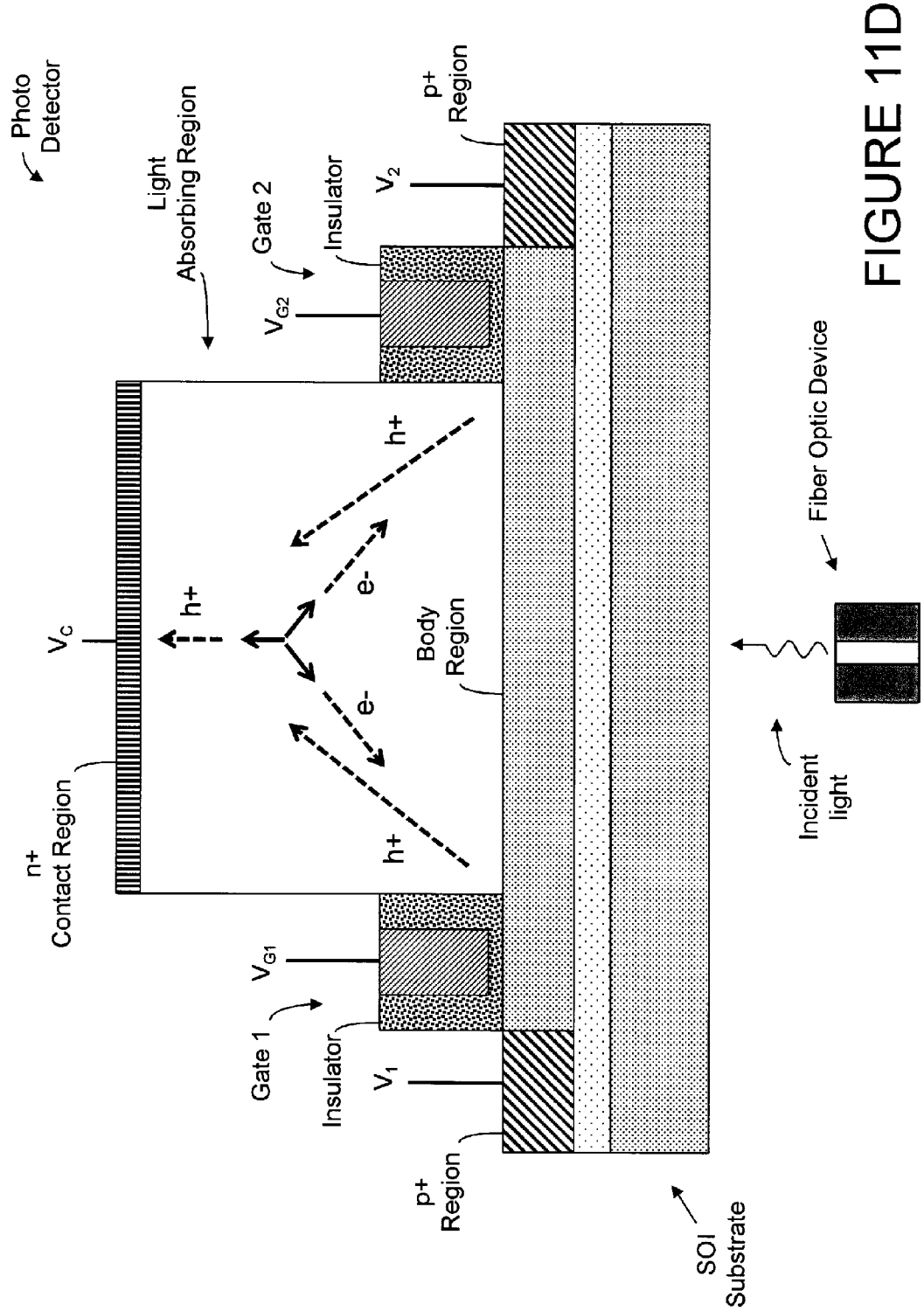

For example, with reference to FIGS. 11A and 11B, where the contact region of the embodiment of FIG. 11A or 11B is an n+ type contact region, the photo detector may be characterized as an n+pnp+ type structure. Here, the materials, architecture and layout of the photo detector may be the same except for the n+ contact region. Accordingly, the discussion above in connection with FIGS. 6A and 6B (for example, the materials) are applicable to this embodiment and, for the sake of brevity will not be repeated.

With reference to FIGS. 11A-11D, in operation, in response to an incident light, electrons and holes are created in the light absorbing region and thereafter are separated where electrons move into the body region (due to the electric field formed by the voltages applied to the gates, n+ contact region, gates and p+ regions), and holes move to the n+ contact region. In one embodiment, the electric field is provided via a positive voltage applied to Gates 1 and 2 (for example, $V_{G1}=V_{G2}=+2V$), a positive voltage is applied to the p+ regions (for example, $V_1=V_2=+1V$), and a negative or ground voltage applied to the contact region (in this exemplary embodiment a n+ contact region, $V_c=0V$).

Thus, the electron-hole pairs are separated by an electric field and the holes flow to the n+ contact region and the electrons flow to portions of the body region near and/or beneath the gates. As excess electrons accumulate in the body region located near and/or beneath the gates, the potential barrier for holes lowers in the body region located near and/or beneath the gates providing for an additional and/or greater hole current to flow from the p+ regions to the contact region thereby increasing the magnitude of the output current. Thus, the photo detectors of FIGS. 11A-11D, in a conductive state or mode, provides a large internal current gain due to a positive feedback mechanism of accumulation of excess negative carriers under the gates, which, in turn, reduces the band gaps corresponding to such regions. The current flows between the p+ regions and the n+ contact region and an output current upon detecting or in response to the incident light.

In each of the embodiment described herein, the detection time or triggering time of the exemplary photo detectors may be programmable or tunable, for example, to meet or accommodate response time specifications as well as power consumption specification. In one embodiment, the voltages applied to the gates are adjusted to increase the response time of the photo detector (for example, by increasing the electric field). In another embodiment, the voltages applied to the gates are decreased to reduce the power consumption of the photo detector. All permutations and combinations thereof are intended to fall within the scope of the present inventions.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

Importantly, the present inventions are neither limited to any single aspect nor embodiment, nor to any combinations and/or permutations of such aspects and/or embodiments. Moreover, each of the aspects of the present inventions, and/or embodiments thereof, may be employed alone or in combination with one or more of the other aspects and/or embodiments thereof. For the sake of brevity, many of those permutations and combinations will not be discussed and/or illustrated separately herein.

Notably, the photo detectors of the present inventions may be implemented in a discrete device (for example, discrete photon receiver element) as well as in conjunction with any type of integrated circuitry (for example, integrated CMOS photon receiver circuitry), whether now known or later developed; all such configurations are intended to fall within the scope of the present inventions. Further, any manufacturing technique, whether now known or later developed, may be employed to fabricate the photo detector and/or photo detector-integrated circuit device of the present inventions; all such techniques are intended to fall within the scope of the present inventions.

Figure 12A:
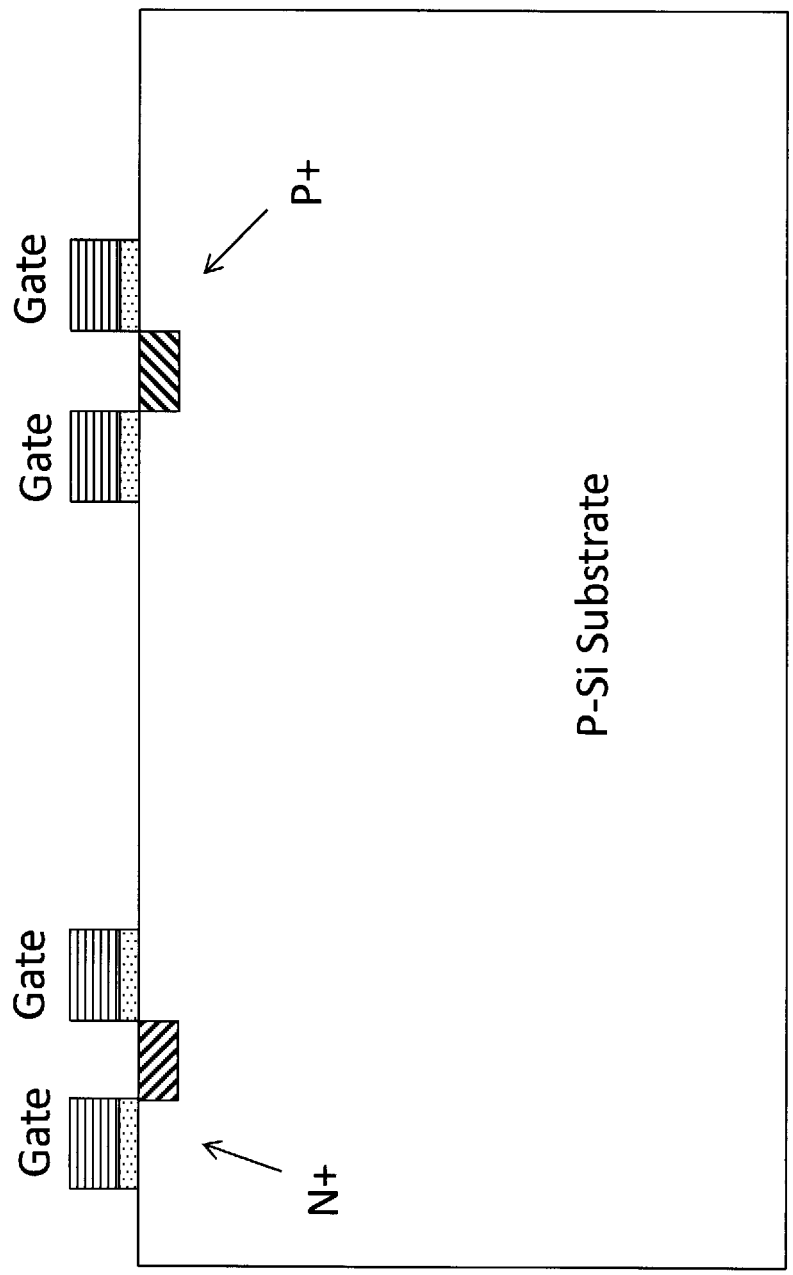
FIGS. 12A and 12F are cross-sectional views of light sensors or photo detectors according to aspects of the present inventions.
Figure 12B:
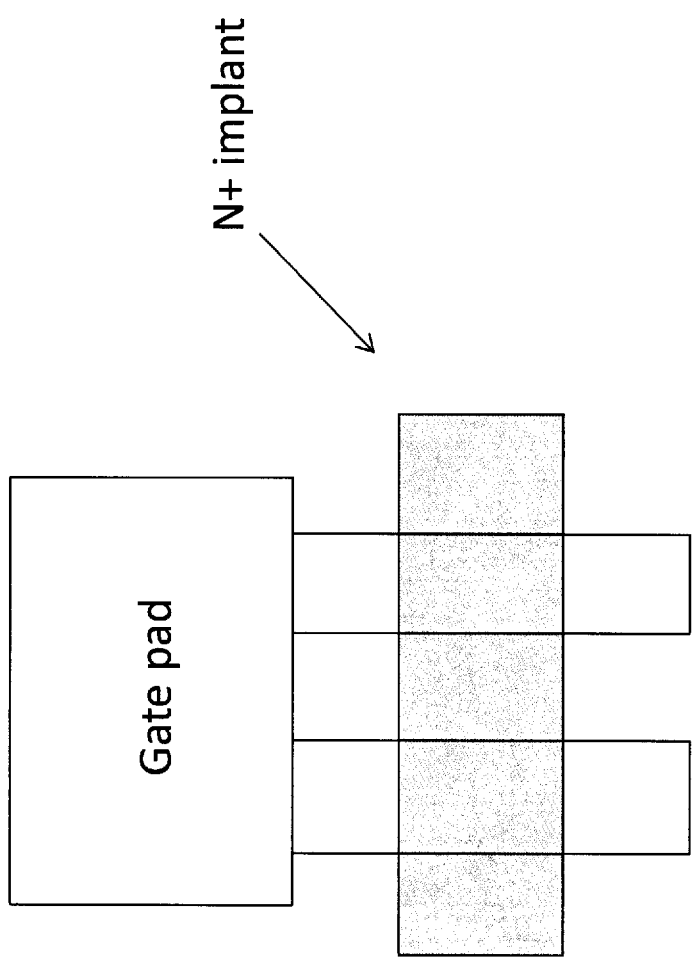
FIGS. 12B-12E are top views illustrating certain fabrication techniques in relation to a CMOS process wherein the sensor includes n+ regions and p+ region (see, for example, the illustrative embodiments of FIGS. 1A, 4A, 5A and 5B), the p+ regions, gates and contact regions may be fabricated during or in relation to the CMOS process of fabricating the PMOS and NMOS transistors; in one embodiment, after forming the gates, an n+ implant may be performed wherein N+ area surrounded by two gates fabricated via CMOS processing (see "X" in FIG. 12B), and thereafter a contact to a portion of the n+ region may be formed (see FIG. 12C), the p+ regions may be formed in a similar manner wherein in one embodiment, after forming the gates, an p+ implant may be performed wherein N+ area surrounded by two gates fabricated via CMOS processing (see FIGS. 12D and 12E); notably.
Figure 12C:
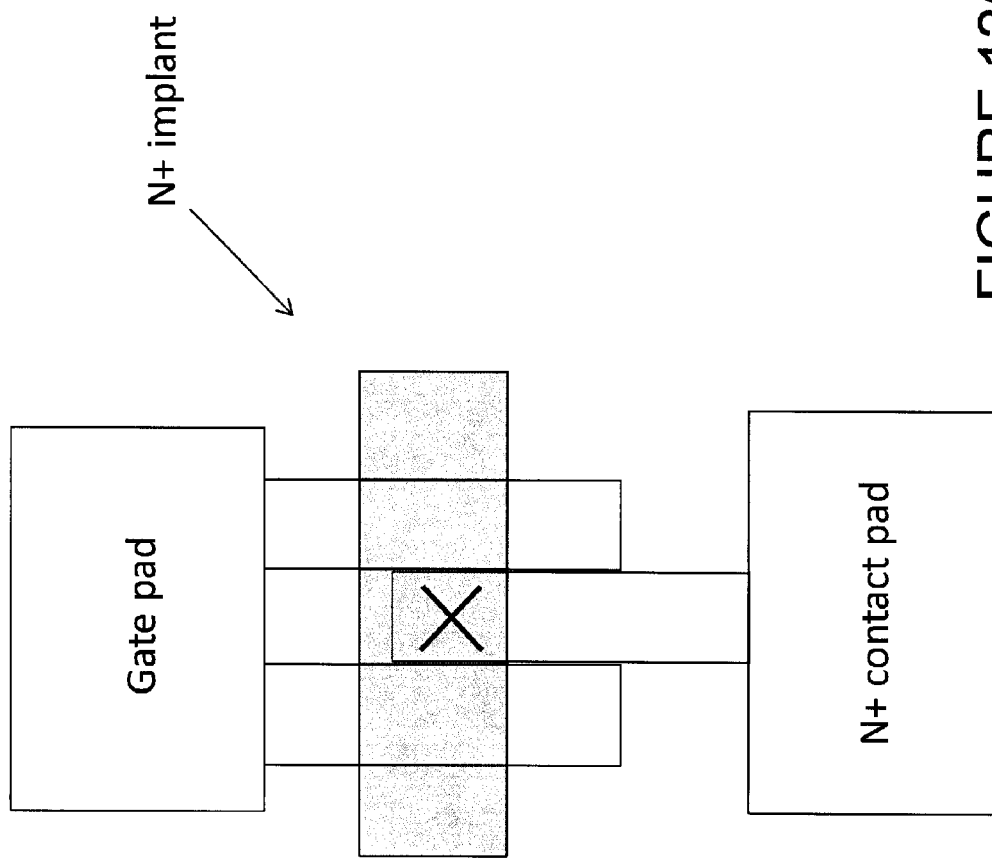
Figure 12D:
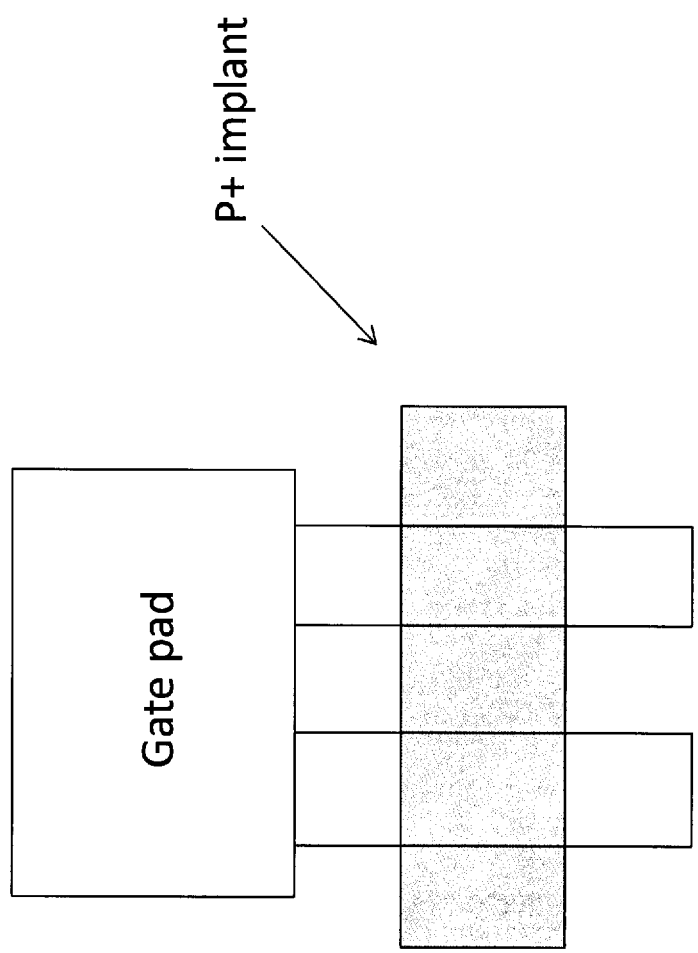
Figure 12E:
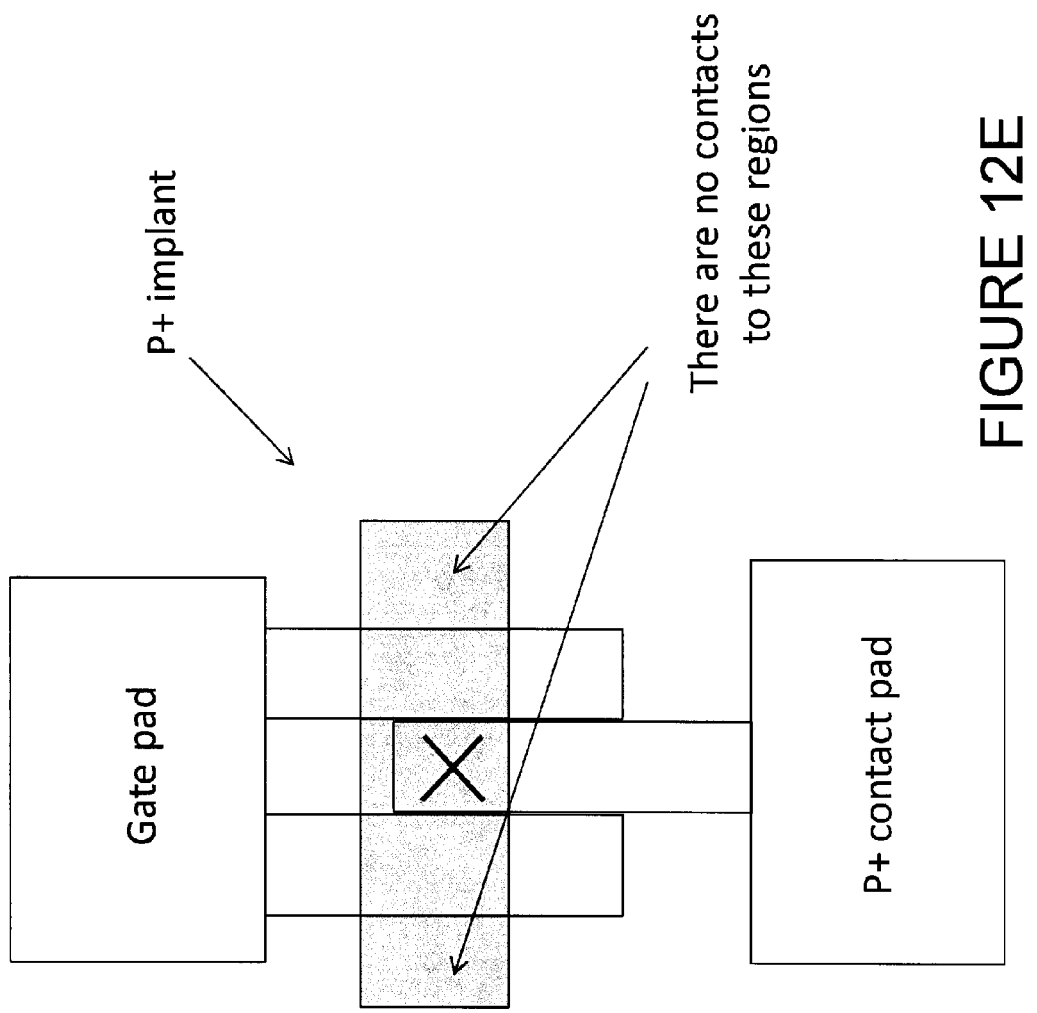
Figure 12F:
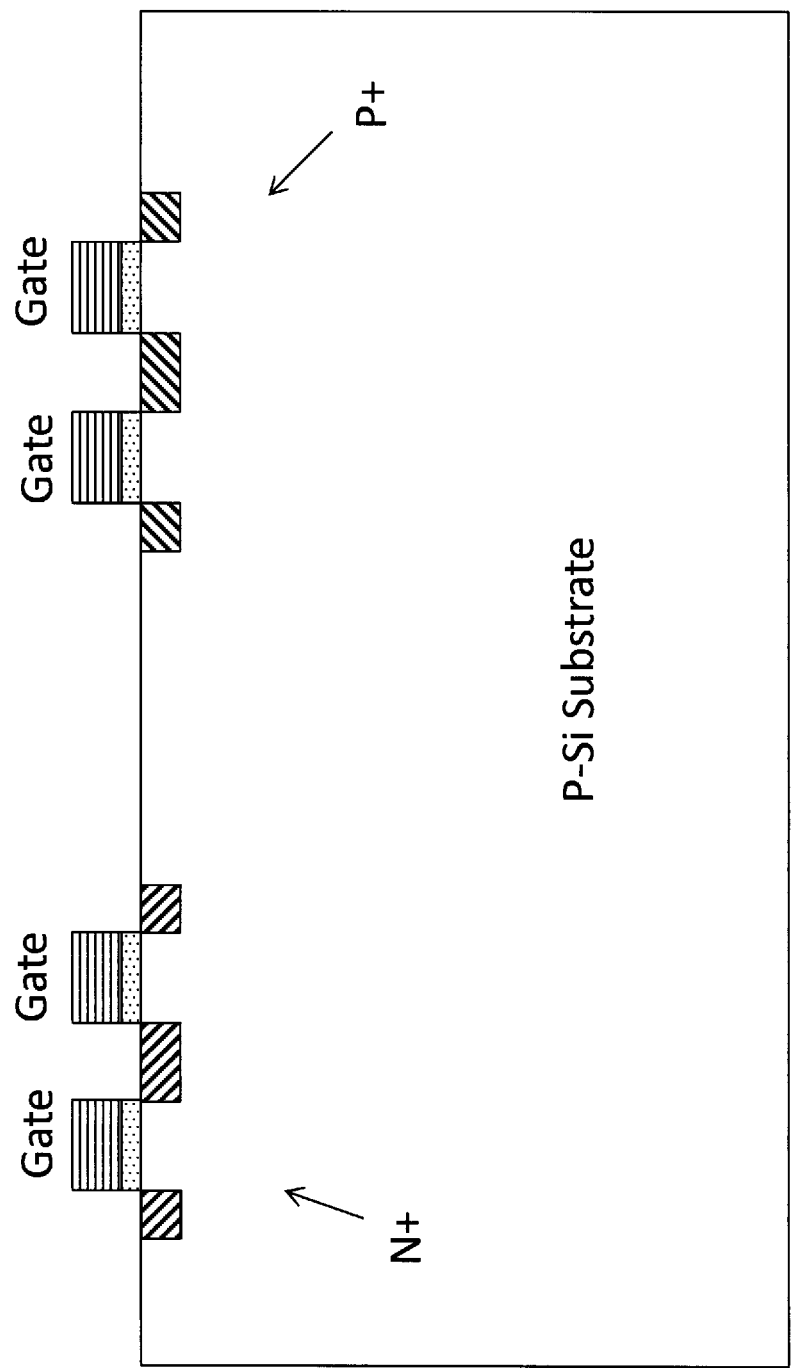

For example, the photo detectors of the present inventions may be fabricated via a CMOS process. (See, for example, FIGS. 12A-12F). For example, where the photo detector includes n+ regions and p+ region (see, for example, the illustrative embodiments of FIGS. 1A, 4A, 5A and 5B), the p+ regions, gates and contact regions may be fabricated during or in relation to the CMOS process of fabricating the PMOS and NMOS transistors. In particular, in one embodiment, after forming the gates, an n+ implant may be performed (see FIG. 12B), and thereafter a contact to a portion of the n+ region may be formed (see FIG. 12C). The p+ regions may be formed in a similar manner (see FIGS. 12D and 12E). FIG. 12F illustrates a cross-section of the resulting or "final" structure. Notably, where the photo detector does not include n+ regions as in several of the exemplary embodiments set forth herein, the n+ processing in connection with the photo detector may be omitted.

The n+ and p+ implantations of the photo detector may be performed during formation of the CMOS transistors. Alternatively, the n+ and p+ implantations of the photo detector may be performed before or after formation of the CMOS transistors. Moreover, the light absorbing regions and contact regions of the photo detectors of FIGS. 1A, 4A, 5A, 5B, 6A and 11A may be fabricated after such CMOS process without impact to the CMOS circuitry.

Figure 13:
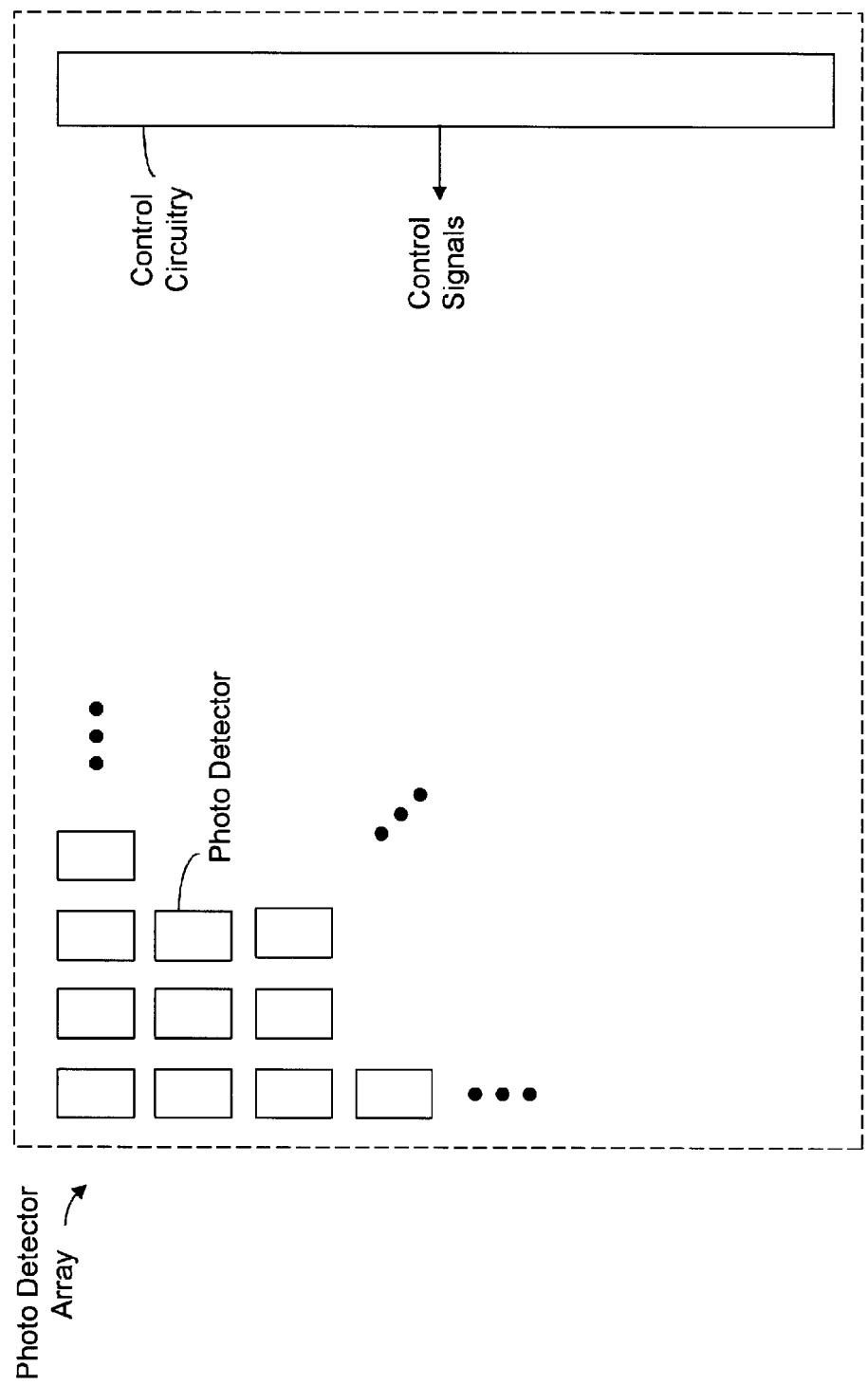
FIG. 13 illustrates an array of light sensors according to another aspect of the invention, wherein the light sensors or photo detectors may be implemented via any of the embodiments described and/or illustrated herein; the array may include, in addition to the array of sensors, control circuitry to manage the acquisition, capture and/or sensing operations of the light sensors of the array—for example, the control circuitry (which may be integrated on the same substrate as the sensors/detectors) may control or enable/disable the light sensors or photo detectors in a manner so that data acquisition or sensing correlates to the data rate of the transmission; the light sensor or photo detector array may be coupled to a plurality of fiber optic output devices wherein each fiber optic device is associated with one or more photo detectors of the array and the control circuitry may control or enable/disable the subset of photo detectors in accordance with the associated output of the fiber optic device.

In another aspect, the present inventions relate to an array of photo detectors according to any of the embodiments described and/or illustrated herein. The array may include, in addition to the array of photo detectors, control circuitry to manage the acquisition, capture and/or sensing operations of the photo detectors of the array. (See, for example, FIG. 13). For example, the control circuitry may control or enable/disable the photo detectors in a manner so that data acquisition or sensing correlates to the data rate of the transmission. In another embodiment, the photo detector array is coupled to a plurality of fiber optic output devices wherein each fiber optic device is associated with one or more photo detectors of the array and the control circuitry may control or enable/disable the subset of photo detectors in accordance with the associated output of the fiber optic device.

The photo detector array may be formed from a plurality of discrete devices and/or from a plurality of photo detectors integrated on a die wherein the photo detector array portion includes a plurality of photo detectors to acquire, capture, convert and/or sense the incident light from one or more associated fiber optic output(s). The photo detectors may be configured and/or arranged in any array architecture as well as in conjunction with any type of integrated circuitry, whether now known or later developed; all such configurations are intended to fall within the scope of the present inventions. Further, any manufacturing technique, whether now known or later developed, may be employed to fabricate the array (which includes a plurality of photo detectors) and/or photo detector array-integrated circuit device embodiments of the present inventions; all such techniques are intended to fall within the scope of the present inventions.

Figure 14:
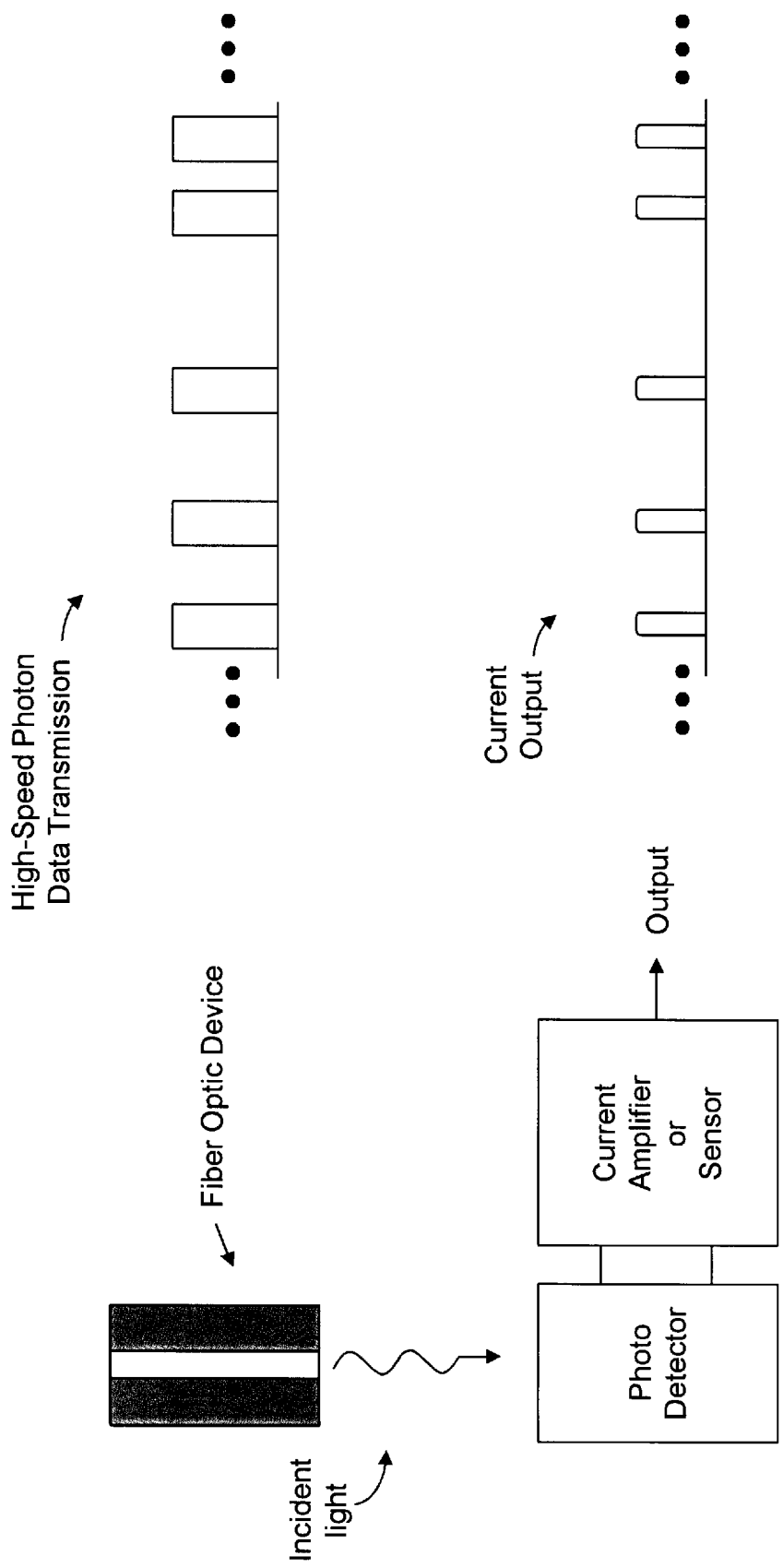
FIG. 14 illustrates the light sensor or photo detector implemented in high-speed data transmission environment that employs photon data transmission (for example, via a fiber optic); the light sensor or photo detector may be implemented via any of the embodiments described and/or illustrated herein and may be coupled to a current amplifier or sensor (and other circuitry) to measure/condition the current output by the sensor (for example, output via the contact region and doped regions in response to the detection of light/data); notably, the current sensor may be a high-speed sense amplifier or the like—wherein all current sensing circuitry and architectures, now known or later developed, are intended to fall within the scope of the present inventions; moreover, the light sensor or photo detector may be discrete devices or integrated with the current amplifier or sensor (and/or other circuitry) as an integrated circuit.

As noted above, the photo detector of the present inventions may be implemented in high-speed data transmission that employs photon data transmission (for example, via a fiber optic). With reference to FIG. 14, the photo detector may be coupled to a current amplifier or photo detector (and other circuitry) to measure/condition the current output by the photo detector (for example, output via the contact region and p+ doped regions in response to the detection of light/data in the exemplary embodiments illustrated in FIGS. 6A, 6B, 8A, 9A, 10A, 11A and 11B). Notably, the current photo detector may be a high-speed sense amplifier or the like. All current sensing circuitry and architectures, now known or later developed, are intended to fall within the scope of the present inventions.

Further, the gates, contact region and p+ regions in the embodiments described and/or illustrated herein may be formed by or in a semiconductor (for example, silicon doped with acceptor impurities). Alternatively, one or more (or all) of such features (gates and regions) may be comprised of or formed (whether wholly or partially) from a metal (for example, aluminum or copper) or metal compound.

Notably, the photo detector, photo detector array and/or die/device (including the photo detector and/or photo detector array) may include an anti-reflective material disposed there over or thereon. In one embodiment, an anti-reflective material is disposed over or on the light absorbing region of the photo detector or photo detectors (of the array of photo detectors). In another embodiment, an anti-reflective material may be disposed on or over the entire structure, or a significant portion thereof.

As noted above, the present inventions may be implemented in a discrete photo detector or in an integrated circuit device having a photon receiver section (which may include one or more photo detectors (including an array of photo detectors)). Moreover, the photo detectors of the present inventions may be implemented in the standard planar technology (as illustrated herein) or any 3D technology (for example, planar or vertical type), or pillar gate architectures). The body region of the photo detector may or may not be electrically floating in view of the insulation or non-conductive region (for example, in bulk-type material/substrate). As illustrated herein, the photo detector may be formed on an SOI substrate or bulk silicon substrate.

It should be noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" may mean, among other things, a current or voltage signal(s) whether in an analog or a digital form, which may be a single bit (or the like) or multiple bits (or the like).

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The present inventions are also directed to such representation of the circuitry described herein, and/or techniques implemented thereby, and, as such, are intended to fall within the scope of the present inventions.

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations and simulation instruction-based expressions using computer aided design, simulation and/or testing tools. The simulation of the circuitry of the present inventions, including the photo detector and/or techniques implemented thereby, may be implemented by a computer system wherein characteristics and operations of such circuitry, and techniques implemented thereby, are simulated, imitated, replicated, analyzed and/or predicted via a computer system. The present inventions are also directed to such simulations and testing of the inventive device and/or circuitry, and/or techniques implemented thereby, and, as such, are intended to fall within the scope of the present inventions. The computer-readable media and data corresponding to such simulations and/or testing tools are also intended to fall within the scope of the present inventions.

Notably, in the claims, the contact region may be disposed and/or formed in the substrate (see, for example, one of the p+ or n+ regions illustrated in the embodiment of FIGS. 1A, 4A 5A and 5B) or disposed and/or formed on the substrate (see, for example, the p+ contact region of the embodiments of FIGS. 6A-6E or the n+ contact region of the embodiments of FIGS. 11A-11D).

What is claimed is:

1. A monolithic photo detector disposed in a substrate, the monolithic photo detector comprising:
    a doped impurity region disposed in the substrate or on a major surface of the substrate, wherein the doped impurity region is configured to receive a first voltage;
    a gate disposed over and spaced from the major surface of the substrate with an insulator and laterally disposed apart from and on a first side of the doped impurity region, wherein the gate is configured to receive a second voltage;
    a contact region, disposed in the substrate or on the major surface of the substrate and laterally disposed apart from and on the first side of the doped impurity region further removed from the first side of the doped impurity region than the gate, wherein the contact region is configured to receive a third voltage; and
    a light absorbing region disposed in the substrate or on the major surface of the substrate and laterally disposed apart from and on the first side of the doped impurity region between the gate and the contact region, wherein the light absorbing region includes at least one material in which, in response to light incident thereon, carrier pairs of opposite charge are generated, each carrier pair including a first type carrier and a second type carrier;
    wherein, in response to light incident on the light absorbing region,
        the gate attracts first type carriers of the carrier pairs which, in response, causes second type carriers from the doped impurity region to flow through the light absorbing region to the contact region, and
        the contact region attracts second type carriers of the carrier pairs.

2. The monolithic photo detector of claim 1 wherein the doped impurity region and the contact region include p-type semiconductor materials.

3. The monolithic photo detector of claim 1 wherein the light absorbing region includes germanium, silicon-germanium or gallium arsenide.

4. The monolithic photo detector of claim 1 wherein the contact region is an n-type semiconductor and the doped impurity region is a p-type semiconductor.

5. The monolithic photo detector of claim 1 wherein the substrate is an SOI or a bulk substrate.

6. The monolithic photo detector of claim 1 further including an insulator disposed between the first gate and the substrate.

7. The monolithic photo detector of claim 1 wherein the contact region is a p-type semiconductor.

8. The monolithic photo detector of claim 1 wherein the light absorbing region includes a material having an electron mobility which is greater than the electron mobility of the substrate.

9. The monolithic photo detector of claim 8 wherein the substrate is an intrinsic or doped semiconductor material.

10. The monolithic photo detector of claim 1 wherein the contact region is an n-type semiconductor region in the substrate.

11. The monolithic photo detector of claim 1 wherein the contact region and the doped impurity region are each disposed in the substrate.

12. The monolithic photo detector of claim 11 wherein;
    a first of the light absorbing region opposes the first side of the doped impurity region;
    the contact region is juxtaposed a second side of the light absorbing region, and
    the first gate is disposed over a region of the substrate which is between the first side of the light absorbing region and the first side of the doped impurity region.

13. The monolithic photo detector of claim 1 further includes first and second outputs, wherein the doped impurity region is electrically connected to the first output of the photo detector and the contact region is electrically connected to the second output of the photo detector.

14. The monolithic photo detector of claim 1 wherein the first and second gates are portions of a single gate.

15. A monolithic photo detector device comprising:
    a bulk substrate;
    a photo detector disposed in the bulk substrate or on the bulk substrate including:
        a doped impurity region disposed in the bulk substrate or on the major surface of the bulk substrate and extending in a first direction over a major surface of the bulk substrate,
    wherein the doped impurity region is configured to receive a first voltage a gate including a first gate portion and a second gate portion, each gate portion being (i) spaced apart from the other and (ii) spaced from and extending in the first direction over the major surface of the bulk substrate, wherein the gate is adapted to receive a second voltage and wherein the doped impurity region is laterally disposed between the first and second gate portions along the first direction;
    a contact region, disposed in or on the major surface of the bulk substrate, wherein the contact region is configured to receive a third voltage; and
    a light absorbing region disposed in or on the major surface of the bulk substrate, wherein the light absorbing region includes at least one material in which, in response to light incident thereon, carrier pairs are generated, each carrier pair including a first type carrier and a second type carrier, and wherein the light absorbing region is laterally disposed between the contact region and the first gate portion of the gate; and wherein, in response to light incident on the light absorbing region, the gate attracts first type carriers of the carrier pairs, and the contact region attracts second type carriers of the carrier pairs; and control circuitry, disposed in or on the bulk substrate and coupled to the photo detector, to generate the first, second and third voltages.

16. The monolithic photo detector device of claim 15 wherein the contact region is an n-type semiconductor and the doped impurity region is a p-type semiconductor.

17. The monolithic photo detector device of claim 16 wherein the photo detector further includes first and second outputs, wherein the doped impurity region is electrically connected to the first output and the contact region is electrically connected to the second output.

18. The monolithic photo detector device of claim 15 wherein the light absorbing region includes a material having an electron mobility which is greater than the electron mobility of the bulk substrate.

19. The monolithic photo detector device of claim 15 wherein the photo detector further includes first and second outputs, wherein the doped impurity region is electrically connected to the first output and the contact region is electrically connected to the second output.

20. The monolithic photo detector device of claim 19 wherein (i) the doped impurity region is a p-type semiconductor region in the bulk substrate, and (ii) the contact region is an n-type semiconductor region in the bulk substrate.

21. The photo detector according to claim 1, where in the gate comprises a first gate portion and a second gate portion, each gate portion being (i) spaced apart from the other and (ii) spaced from and extending in the first direction over the major surface of the substrate, wherein the gate is configured to receive a second voltage and wherein the doped impurity region is laterally disposed between the first and second gate portions along the first direction.

22. The photo detector according to claim 1, where in the gate comprises a single gate portion that continuously surrounds the perimeter of the laterally disposed doped impurity region over the major surface of the substrate, wherein the gate is configured to receive a second voltage.

* * * * *